US010490421B2

United States Patent
Cho et al.

(10) Patent No.: US 10,490,421 B2
(45) Date of Patent: Nov. 26, 2019

(54) PRINTED CIRCUIT BOARD

(71) Applicant: LG INNOTEK CO., LTD., Seoul (KR)

(72) Inventors: Sung Oh Cho, Seoul (KR); Yoon Tai Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/393,323

(22) Filed: Apr. 24, 2019

(65) Prior Publication Data

US 2019/0252210 A1    Aug. 15, 2019

Related U.S. Application Data

(63) Continuation of application No. 16/146,104, filed on Sep. 28, 2018, now Pat. No. 10,347,507.

(30) Foreign Application Priority Data

Sep. 29, 2017   (KR) .................. 10-2017-0127395
Jun. 1, 2018    (KR) .................. 10-2018-0063237

(51) Int. Cl.
   *H01L 21/48*   (2006.01)
   *H01L 23/498*  (2006.01)

(52) U.S. Cl.
   CPC .... *H01L 21/4853* (2013.01); *H01L 23/49816* (2013.01); *H01L 23/49822* (2013.01); *H01L 23/49866* (2013.01); *H01L 2224/48091* (2013.01); *H01L 2224/48227* (2013.01); *H01L 2924/15311* (2013.01); *H01L 2924/181* (2013.01)

(58) Field of Classification Search
   CPC .......... H01L 21/4853; H01L 23/49816; H01L 2924/181; H01L 2224/48227; H01L 2924/15311; H01L 2224/48091
   USPC ................................................ 174/257, 260
   See application file for complete search history.

(56) References Cited

U.S. PATENT DOCUMENTS

| | | |
|---|---|---|
| 6,282,094 B1 | 8/2001 | Lo et al. |
| 6,372,540 B1 | 4/2002 | Huernoeller |
| 6,525,942 B2 | 2/2003 | Huang et al. |

(Continued)

FOREIGN PATENT DOCUMENTS

| | | |
|---|---|---|
| KR | 10-0499006 B1 | 7/2005 |
| KR | 10-0584965 B1 | 5/2006 |
| KR | 10-0826360 B1 | 5/2008 |

OTHER PUBLICATIONS

Notice of Allowance dated Jan. 28, 2019 in U.S. Appl. No. 16/146,104.

*Primary Examiner* — Sherman Ng
(74) *Attorney, Agent, or Firm* — Saliwanchik, Lloyd & Eisenschenk

(57) ABSTRACT

A printed circuit board according to an embodiment includes: an insulating layer; a first pad disposed on a first surface of the insulating layer; a first conductive layer disposed on the first pad and including gold (Au); a second pad disposed on a second surface of the insulating layer; and a second conductive layer disposed on the second pad and including gold (Au), wherein the first conductive layer is a conductive layer connected to a wire, the second conductive layer is a conductive layer connected to a solder, and the first conductive layer is thicker than the second conductive layer.

20 Claims, 12 Drawing Sheets

(56) References Cited

U.S. PATENT DOCUMENTS

| | | | |
|---|---|---|---|
| 6,972,152 B2 * | 12/2005 | Taggert | C23C 30/00 |
| | | | 174/257 |
| 7,626,270 B2 | 12/2009 | Chen et al. | |
| 7,705,471 B2 | 4/2010 | Hu | |
| 7,763,892 B2 | 7/2010 | Miura et al. | |
| 8,927,875 B2 | 1/2015 | Furuta et al. | |
| 2004/0099961 A1 * | 5/2004 | Chu | H01L 21/4846 |
| | | | 257/781 |
| 2004/0150080 A1 | 8/2004 | Lee et al. | |
| 2004/0173375 A1 | 9/2004 | Lee et al. | |
| 2006/0121719 A1 | 6/2006 | Nakamura et al. | |
| 2008/0257742 A1 | 10/2008 | Lee et al. | |
| 2010/0309641 A1 | 12/2010 | Hata et al. | |
| 2011/0316172 A1 * | 12/2011 | Igarashi | H01L 21/563 |
| | | | 257/777 |
| 2012/0018864 A1 | 1/2012 | Krishnan et al. | |
| 2015/0000966 A1 | 1/2015 | Jo et al. | |

\* cited by examiner

PRINTED CIRCUIT BOARD

CROSS-REFERENCE TO RELATED APPLICATIONS

This application is a continuation of U.S. application Ser. No. 16/146,104, filed Sep. 28, 2018; which claims the benefit under 35 U.S.C. § 119 to Korean Patent Application Nos. 10-2017-0127395, filed Sep. 29, 2017; and 10-2018-0063237, filed Jun. 1, 2018, which are hereby incorporated in their entirety.

TECHNICAL FIELD

The present invention relates to a printed circuit board, and more particularly, to a printed circuit board including an upper conductive layer and a lower conductive layer having different thicknesses at upper and lower portions, and a method of manufacturing the same.

BACKGROUND

A printed circuit board (PCB) is formed by printing a circuit line pattern at an electrical insulating substrate with a conductive material such as copper, and thus the PCB refers to a board just before electronic components are mounted thereon. That is, in order to densely mount various types of electronic components on a planar surface, the PCB refers to a circuit board having a planar surface on which a mounting position of each component is fixed and a circuit pattern connecting the components is fixedly printed.

In general, a surface processing method for a circuit pattern included in the above-described PCB uses an organic solderability preservative (OSP) method, an electrolytic nickel/gold method, an electrolytic nickel/gold-cobalt alloy method, an electroless nickel/palladium/gold method, etc.

Here, the above-described surface processing methods vary depending on a use thereof, and the use includes, for example, soldering, wire bonding, and a connector.

FIG. 1 is a view illustrating a printed circuit board according to the related art.

Referring to FIG. 1, a printed circuit board 10 includes a plurality of insulating layers 11, a circuit pattern 12 disposed at a surface of the plurality of insulating layers 11, and a via 13 configured to pass through at least one among the plurality of insulating layers 11 and electrically connect circuit patterns disposed at different layers.

In addition, a first pad 14 is disposed on an insulating layer disposed at an uppermost layer among the plurality of insulating layers 11, and an upper conductive layer 15 is disposed on the first pad 14.

Further, a second pad 16 is disposed under an insulating layer disposed at a lowermost layer among the plurality of insulating layers 11, and a lower conductive layer 17 is disposed under the second pad 16.

Furthermore, a protective layer 18 having an opening, through which at least a part of a surface of the lower conductive layer 17 is exposed, is disposed under the insulating layer disposed at the lowermost layer.

In the above-described printed circuit board 10, pads having different functions are disposed at the uppermost and lowermost portions of the plurality of insulating layers 11, respectively. That is, the first pad 14 may be a pad for wire bonding, which is electrically connected to an electronic component (not shown) via a wire. In addition, the second pad 16 may be a pad for soldering, which is electrically connected to an external substrate via an adhesive member (not shown).

The upper conductive layer 15 and the lower conductive layer 17 are disposed at surfaces of the first pad 14 and the second pad 16, respectively. The upper conductive layer 15 and the lower conductive layer 17 are disposed to perform wire bonding or soldering together with a purpose of inhibiting oxidation of the pad.

However, although thicknesses of the upper conductive layer and the lower conductive layer are different depending on the use of the pad, the upper conductive layer 15 and the lower conductive layer 17 are formed to have the same thickness in the related art. At this point, the upper conductive layer 15 and the lower conductive layer 17 generally include gold (Au). Therefore, in the related art, the thickness of the lower conductive layer 17 is formed based on the thickness required for the upper conductive layer 15, so that there is a problem that a manufacturing cost due to unnecessary consumption of gold is increased. Further, in the related art, in order to reduce a plating thickness of the upper conductive layer or the lower conductive layer including gold, copper/nickel is mainly formed as an underlying layer, so that there is a problem that a product thickness increases due to an increase in the layer.

SUMMARY

In an embodiment according to the present invention, there is provided a printed circuit board having a new structure and a method of manufacturing the same.

In addition, in an embodiment according to the present invention, there is provided a printed circuit board capable of electrolytic-plating an upper conductive layer and a lower conductive layer using a plating seed layer used at the time of forming a pad, and a method of manufacturing the same.

Further, in an embodiment according to the present invention, there is provided a printed circuit board capable of forming an upper conductive layer and a lower conductive layer having different thicknesses depending on a use of a pad, and a method of manufacturing the same.

Furthermore, in an embodiment according to the present invention, there is provided a printed circuit board capable of directly forming an upper conductive layer and a lower conductive layer including gold on a pad including copper, and a method of manufacturing the same.

In addition, in an embodiment according to the present invention, there is provided a printed circuit board having a pad including a first pattern having at least a part of an upper surface having a curvature and a second pattern filling the curvature portion of the first pattern, and a method of manufacturing the same.

Further, in the present invention, there is provided a printed circuit board including an upper conductive layer and a lower conductive layer having a portion on a pad, which protrudes from a side surface of the pad to an outside thereof and at least a part of which is not in contact with the pad, and a method of manufacturing the same.

Furthermore, the objectives of the present invention are not limited to the above, and other objectives will be clearly understood to those skilled in the art from the following descriptions.

A printed circuit board according to an embodiment includes: an insulating layer; a first pad disposed on a first surface of the insulating layer; a first conductive layer disposed on the first pad and including gold (Au); a second pad disposed on a second surface of the insulating layer; and a second conductive layer disposed on the second pad and including gold (Au), wherein the first conductive layer is a conductive layer connected to a wire, the second conductive layer is a conductive layer connected to a solder, and the first conductive layer is thicker than the second conductive layer.

In addition, the insulating layer includes a plurality of insulating layers, the first pad is disposed on an upper surface of an insulating layer disposed at an uppermost portion of the plurality of insulating layers, and the second pad is disposed under a lower surface of an insulating layer disposed at a lowermost portion of the plurality of insulating layers.

Further, the first pad has a narrower width than the second pad.

Furthermore, the first conductive layer has a thickness in a range of 0.2 to 0.8 μm, and the second conductive layer has a thickness in a range of 0.05 to 0.3 μm.

In addition, each of the first pad and the second pad includes a plating seed layer disposed at a surface of the uppermost insulating layer or the lowermost insulating layer and including copper, a first pattern disposed on the plating seed layer and including copper, and a second pattern disposed on the first pattern and including copper.

Further, the first pattern is thicker than the second pattern.

Furthermore, a central portion of an upper surface of the first pattern is located lower than an outer side portion thereof.

In addition, a part of a lower surface of the second pattern is located lower than a part of the upper surface of the first pattern.

Further, each of the first and second conductive layers includes a first region in contact with the second pattern, and a second region extending from the first region and spaced apart from the plating seed layer, the first pattern and the second pattern, and the second region is not in contact with the plating seed layer, the first pattern, and the second pattern.

Furthermore, the second region includes a first portion in direct contact with an upper surface of the second pattern and a second portion in direct contact with a side surface of the second pattern.

In addition, the first conductive layer is disposed in plural on the first surface of the insulating layer, and the second conductive layer is disposed in plural under the second surface of the insulating layer.

Further, a printed circuit board according to an embodiment includes: an insulating layer; a pad disposed on the insulating layer; and a conductive layer disposed on the pad, wherein the conductive layer includes a first region in direct contact with an upper surface of the pad, a second region extending from the first region and in direct contact with a side surface of the pad, and a third region extending from the second region and spaced apart from the pad.

Furthermore, a width of the upper surface of the pad is larger than that of a lower surface thereof.

In addition, the pad includes a first pad disposed on a first surface of the insulating layer, and a second pad disposed on a second surface of the insulating layer opposite to the first surface, and the conductive layer includes a first conductive layer disposed on the first pad and including gold (Au), and a second conductive layer disposed on the second pad and including gold (Au), and each of the first and second conductive layers includes the first to third regions.

Further, a thickness of the first region in a longitudinal direction of the first conductive layer is larger than that of the first region in a longitudinal direction of the second conductive layer.

Furthermore, a thickness of the second region in a lateral direction of the first conductive layer is larger than that of the second region in a lateral direction of the second conductive layer.

In addition, each of the first pad and the second pad includes a plating seed layer disposed on the first surface or the second surface of the insulating layer and including copper, a first pattern disposed on the plating seed layer and including copper, and a second pattern disposed on the first pattern and including copper.

Further, an end portion of the third region of the first conductive layer is located higher than an outer side region of an upper surface of the first pattern constituting the first pad, and an end portion of the third region of the second conductive layer is located lower than an outer side region of a lower surface of the first pattern constituting the second pad.

Furthermore, a thickness of the third region in a longitudinal direction of the first conductive layer is different from that of the third region in a longitudinal direction of the second conductive layer.

Meanwhile, a method of manufacturing a printed circuit board according to an embodiment includes: stacking a plurality of insulating layers and forming a circuit pattern at a surface of the plurality of insulating layers; forming first and second plating seed layers at an insulating layer disposed at an uppermost portion and an insulating layer disposed at a lowermost portion of the plurality of insulating layers, respectively; forming a first pad and a second pad on the first and second plating seed layers, respectively; and proceeding electrolytic plating in a plating tank in which plating spaces on the surface on which the first pad is formed and on the surface on which the second pad is formed are separated to form a first conductive layer on the first pad and a second conductive layer on the second pad, wherein the first conductive layer is formed to have a thickness greater than that of the second conductive layer in the same plating tank in which the second conductive layer is formed.

In addition, the forming of the first conductive layer and the second conductive layer includes differently applying a plating condition in which the first conductive layer is formed and a plating condition in which the second conductive layer is formed to simultaneously form the first conductive layer and the second conductive layer having different thicknesses.

Further, each of the first and second conductive layers is formed of a metal including gold.

Furthermore, the forming of the first pad and the second pad includes forming a first pattern, formed of a metal including copper, on the first and second plating seed layers, respectively, preprocessing an upper surface of the formed first pattern to have a curvature, and forming a second pattern, formed of a metal including copper, having a thickness thinner than the first pattern on the preprocessed first pattern.

In addition, a part of a lower surface of the second pattern is located lower than that of the upper surface of the first pattern.

Further, each of the first and second conductive layers includes a first region in contact with the second pattern, and a second region extending from the first region and spaced apart from the plating seed layer, the first pattern and the second pattern, wherein the second region is not in contact with the plating seed layer, the first pattern, and the second pattern.

Advantageous Effects

According to an embodiment of the present invention, since a second pattern filling an edge region of a first pattern is formed on the first pattern, and an upper conductive layer and a lower conductive layer are formed on the formed second pattern, it is possible to solve a reliability problem that occurs when the upper conductive layer or the lower conductive layer permeates between a mask.

In addition, according to an embodiment of the present invention, an upper conductive layer and a lower conductive layer are formed after the second pattern is formed, so that a portion, protruding from a side surface of a pad to an outside thereof, of the upper conductive layer and the lower conductive layer may be minimized, and thus structural reliability (stability) of the upper conductive layer and the lower conductive layer can be secured.

Further, according to an embodiment of the present invention, an upper conductive layer and a lower conductive layer are formed after the second pattern is formed, so that a portion of a lower surface of the second pattern is disposed to be lower than an upper surface of the first pattern, and a thickness of the second pattern is thinner than that of the first pattern, and thus overspreading itself of the upper conductive layer and the lower conductive layer can be inhibited.

Furthermore, according to an embodiment of the present invention, an upper conductive layer and a lower conductive layer including gold (Au) are formed by using a plating seed layer used at the time of forming the first pattern and the second pattern, so that a nickel (Ni) seed layer which has served as a seed layer of a gold (Au) conductive layer in the related art may be removed, and thus, not only a thickness of a printed circuit board product can be reduced, but also economic efficiency of a product can be improved by technical effect due to efficiency of a process.

In addition, according to an embodiment of the present invention, a nickel layer may be removed from a pattern structure, and thus not only electrical conductivity of a pattern can be improved, but also a problem of interface property occurring between copper and nickel constituting the pattern can be solved.

Further, according to an embodiment of the present invention, a thickness of an upper conductive layer disposed on a pad for wire bonding and a thickness of a lower conductive layer disposed on a pad for soldering are differently applied, so that a consumption cost of gold used for the upper conductive layer and the lower conductive layer may be reduced, and thus a thickness can be reduced.

Furthermore, according to an embodiment of the present invention, an upper conductive layer and a lower conductive layer having different thicknesses may be formed by one simultaneous process, and thus efficiency in a manufacturing process can be improved.

DETAILED DESCRIPTION OF THE EMBODIMENTS

Figure 1:
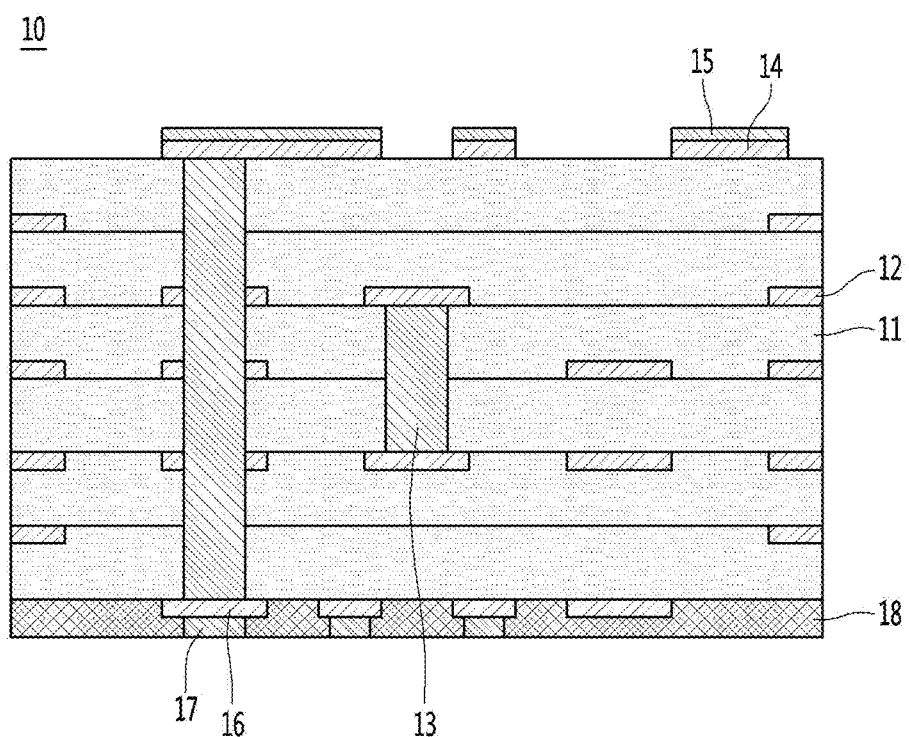
FIG. 1 is a view illustrating a printed circuit board according to the related art.

Hereinafter, embodiments of the present invention will be described in detail with reference to the accompanying drawings so that a person skilled in the art to which the present invention belongs can easily carry out. However, the present invention may be embodied in many different forms and is not limited to the embodiments described herein.

Throughout the specification, when a part is referred to as "including" an element, it means that the part may include other elements as well without excluding the other elements unless specifically stated otherwise.

Further, structures and elements which do not relate to the detail description are not shown in the drawings to clearly describe the present invention, thicknesses may be exaggerated to clearly explain various layers and regions, and similar elements in the following description are designated by similar reference numerals.

It will be understood that when a portion such as a layer, a film, a region, a plate or the like is referred to as being "on" another portion, it can be "directly formed on" another portion, or a third portion can be interposed between the portions. Otherwise, when a portion is "directly formed on" another portion, it means that there is no third portion between the portions.

In the present invention, there is provided a new printed circuit board (PCB) on which a surface processing process may be performed after filling corner portions of a pattern, etched by a preprocessing process, based on a flash process and a method of manufacturing the same.

In addition, in the present invention, there is provided a printed circuit board in which an upper conductive layer and a lower conductive layer are simultaneously formed at a pad for wire bonding disposed at an upper portion of a board and a pad for soldering disposed at a lower portion of the board and have different thicknesses, and a method for manufacturing the same.

Figure 2:
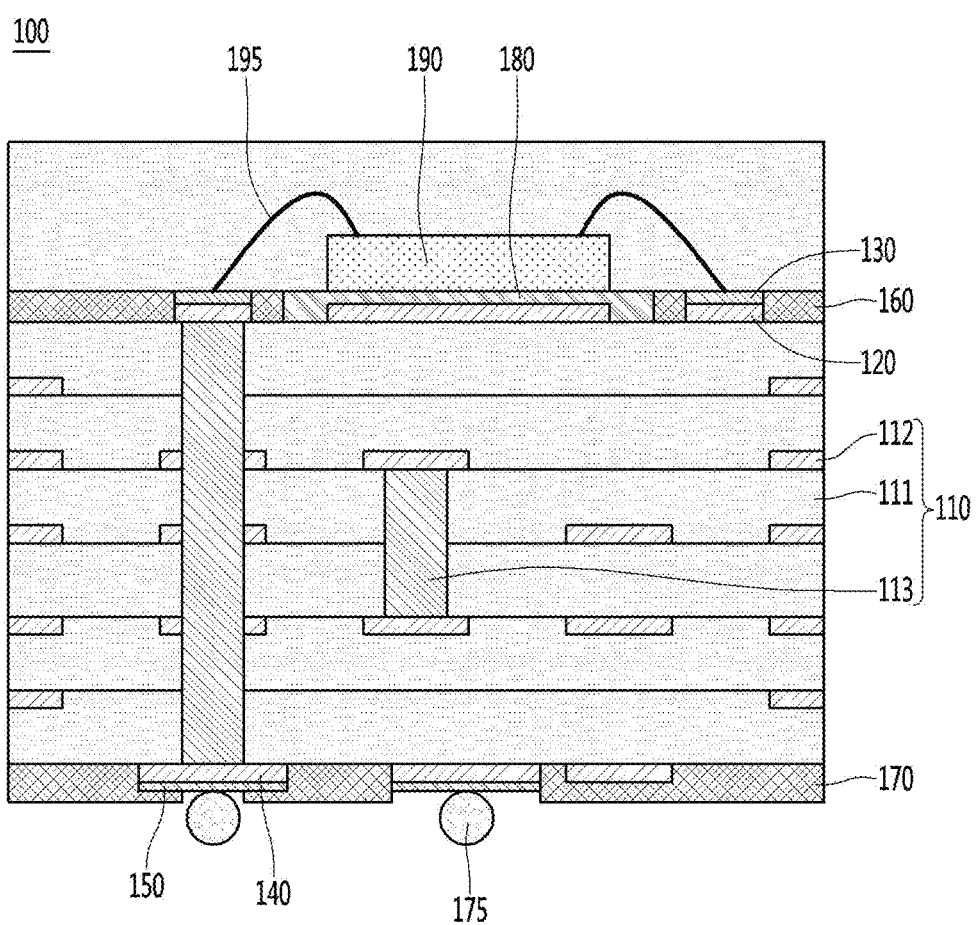
FIG. 2 is a view illustrating a printed circuit board 100 according to an embodiment of the present invention.

FIG. 2 is a view illustrating a printed circuit board 100 according to an embodiment of the present invention.

Referring to FIG. 2, the printed circuit board 100 includes an insulating substrate 110, a first pad 120, an upper conductive layer 130, a second pad 140, a lower conductive layer 150, a first passivation layer 160, a second passivation layer 170, an adhesive member 175, a solder paste 180, an electronic component 190, and a wire 195. Here, the upper conductive layer 130 may be referred to as a first conductive layer, and the lower conductive layer 150 may be referred to as a second conductive layer. However, hereinafter, the upper conductive layer and the lower conductive layer will be referred to as an upper conductive layer and a lower conductive layer, respectively, depending on positions in which each of conductive layers is disposed centering on the insulating substrate 110, in order to differentiate each of the conductive layers.

Referring to FIG. 2, the insulating substrate 110 may have a flat plate structure. The insulating substrate 110 may be a printed circuit board (PCB). Here, the insulating substrate 110 may be implemented as a single substrate, and alternatively, may be implemented as a multilayer substrate in which a plurality of insulating layers are sequentially stacked.

Accordingly, the insulating substrate 110 includes a plurality of insulating layers 111. As shown in FIG. 2, the plurality of insulating layers 111 may include a first insulating layer, a second insulating layer, a third insulating layer, a fourth insulating layer, a fifth insulating layer, and a sixth insulating layer from an uppermost portion. In addition, a circuit pattern 112 may be disposed at each of surfaces of the first to sixth insulating layers.

That is, the plurality of insulating layers 111 is a substrate on which an electrical circuit capable of changing wirings is disposed and may include all of printing, a wiring plate, and an insulating substrate which are formed of an insulating material which is able to form a circuit pattern 112 at a surface of the insulating layer.

The plurality of insulating layers 111 may be rigid or flexible. For example, the insulating layer 111 may include glass or plastic. Specifically, the insulating layer 111 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 111 may include an optically isotropic film. For example, the insulating layer 111 may include cyclic olefin copolymer (COC), cyclic olefin polymer (COP), optically isotropic PC, optically isotropic polymethylmethacrylate (PMMA), etc.

Furthermore, the insulating layer 111 may be partially bent while having a curved surface. That is, the insulating layer 111 may partially have a plane and may partially be bent while having a curved surface. Specifically, an end portion of the insulating layer 111 may be bent while having a curved surface, or bent or crooked while having a surface with a random curvature.

In addition, the insulating layer 111 may be a flexible substrate having flexibility. Further, the insulating layer 111 may be a curved or bent substrate. At this point, the insulating layer 111 may form a wiring layout for electrical wirings which connect circuit components based on a circuit design, and electrical conductors may be disposed on an insulating material. Furthermore, electrical components may be mounted on the insulating layer 111, and the insulating layer 111 may form wirings configured to connect the electrical components to make a circuit, and may mechanically fix the components besides functioning to electrically connect the components.

Each of the circuit patterns 112 is disposed at the surface of the insulating layer 111. The circuit pattern 112 may be a wiring for transmitting an electrical signal, and may be formed of a metal material having high electrical conductivity. For this, the circuit pattern 112 may be formed of at least one metal material selected from among gold (Au), silver (Ag), platinum (Pt), titanium (Ti), tin (Sn), copper (Cu), and zinc (Zn). In addition, the circuit pattern 112 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the circuit pattern 112 may be formed of copper (Cu) having high electrical conductivity and a relatively low cost.

The circuit pattern 112 may be formed by a general process of manufacturing a PCB, such as an additive process, a subtractive process, a modified semi additive process (MSAP), a semi additive process (SAP), etc., and detailed descriptions thereof will be omitted herein.

At least one via 113 is formed in the insulating layer 111. The via 113 is disposed to be passing through at least one of the plurality of insulating layers 111. The via 113 may pass through only one of the plurality of insulating layers 111, and alternatively, may be formed to commonly pass through at least two insulating layers of the plurality of insulating layers 111. Accordingly, the via 113 electrically connects circuit patterns disposed at surfaces of different insulating layers to each other.

The via 113 may be formed by filling, with a conductive material, a through hole (not shown) passing through at least one of the plurality of insulating layers 111.

The through hole may be formed by any one of mechanical, laser, and chemical processing. When the through hole is formed by mechanical processing, a method such as milling, drilling and routing may be used. When the through hole is formed by laser processing, a method of UV or $CO_2$ laser may be used. And when the through hole is formed by chemical processing, the insulating layer 111 may be opened by using a chemical including aminosilane, ketone, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulating layer, and the $CO_2$ laser is a laser capable of processing only an insulating layer.

When the through hole is formed, the via 113 is formed by filling the inside of the through hole with a conductive material. The metal material forming the via 113 may be anyone selected from among copper (Cu), silver (Ag), tin (Sn), gold (Au), nickel (Ni), and palladium (Pd). The conductive material may be filled by any one of electroless plating, electrolytic plating, screen printing, sputtering, evaporation, ink jetting, and dispensing, or a combination thereof.

The first pad 120 is disposed on the insulating layer disposed at the uppermost portion of the plurality of insulating layers 111 and the second pad 140 is disposed under the insulating layer disposed at the lowermost portion of the plurality of insulating layers 111.

In other words, the first pad 120 is disposed on the uppermost insulating layer 111 in which the electronic component 190 is to be formed, among the plurality of insulating layers 111. The first pad 120 may be formed in plural on the uppermost insulating layer. In addition, a part of the first pad 120 may serve as a pattern for signal transmission and the other part thereof may serve as an inner lead electrically connected to the electronic component 190 through the wire 195. In other words, the first pad 120 includes a wire-bonding pad for wire bonding.

In addition, the second pad 140 is disposed under the lowermost insulating layer to which an external substrate (not shown) is to be attached, among the plurality of insulating layers 111. Like the first pad 120, a part of the second pad 140 also serves as a pattern for signal transmission, and the other part thereof may serve as an outer lead in which the adhesive member 175 is disposed for attachment of the external substrate. In other words, the second pad 140 includes a soldering pad for soldering.

In addition, the upper conductive layer 130 is disposed on the first pad 120 and the lower conductive layer 150 is disposed under the second pad 140. The upper conductive layer 130 and the lower conductive layer 150 are formed of the same material and increase characteristics of the wire bonding or soldering while protecting the first pad 120 and the second pad 140, respectively.

For this, the upper conductive layer 130 and the lower conductive layer 150 are formed of a metal including gold (Au). Preferably, the upper conductive layer 130 and the lower conductive layer 150 may include pure gold (purity of 99% or more) only, or may be formed of an alloy including gold (Au). When the upper conductive layer 130 and the lower conductive layer 150 are formed of an alloy including gold, the alloy may be formed of a gold alloy including cobalt.

The solder paste 180 is disposed at the uppermost insulating layer among the plurality of insulating layers. The solder paste is an adhesive for fixing the electronic component 190 attached to the insulating substrate 110. Accordingly, the solder paste 180 may be referred to as an adhesive. The adhesive may be a conductive adhesive, or alternatively, the adhesive may be a non-conductive adhesive. That is, the printed circuit board 100 may be a substrate to which the electronic component 190 is attached in a wire-bonding manner, so that a terminal (not shown) of the electronic component 190 is not disposed on the adhesive. In addition, the adhesive is not electrically connected to the electronic component 190. Therefore, a non-conductive adhesive may be used as the adhesive, or alternatively, a conductive adhesive may be used as the adhesive.

The conductive adhesive is largely classified into an anisotropic conductive adhesive and an isotropic conductive adhesive, and is basically composed of conductive particles such as Ni, Au/polymer, or Ag, and thermosetting and thermoplastic resins, or a blend type insulating resin mixing characteristics of the two resins.

In addition, the non-conductive adhesive may also be a polymeric adhesive and may preferably be a non-conductive polymer adhesive including a thermosetting resin, a thermoplastic resin, a filler, a curing agent, and a curing accelerator.

Further, the first passivation layer 160, through which at least a part of a surface of the upper conductive layer 130 is exposed, is disposed on the uppermost insulating layer. The first passivation layer 160 is disposed to protect the surface of the uppermost insulating layer, and, for example, may be a solder resist.

In addition, the wire 195 is bonded to the upper conductive layer 130 so that the first pad 120 and the electronic component 190 may be electrically connected to each other.

Here, the electronic component 190 may include both a device and a chip. The device may be classified into an active device and a passive device. The active device refers to a device that positively uses non-linear characteristics. The passive device refers to a device that does not use non-linear characteristics even though both linear and non-linear characteristics are present. In addition, the passive device may include a transistor, an IC semiconductor chip, and the like and the passive device may include a condenser, a resistor, an inductor, and the like. The passive device is mounted on a substrate together with an ordinary semiconductor package in order to increase a signal processing speed of a semiconductor chip which is an active device, perform a filtering function, or the like.

As a result, the electronic component 190 may include all of a semiconductor chip, a light emitting diode chip, and other driving chips.

In addition, a resin molding part is formed on the uppermost insulating layer, so that the electronic component 190, the wire 195, and the wire-bonded upper conductive layer 130 may be protected by the resin molding part.

Meanwhile, the second passivation layer 170 is disposed under the lowermost insulating layer among the plurality of insulating layers. The second passivation layer 170 has an opening exposing an surface of the lower conductive layer 150 on which the adhesive member 175 is to be disposed. The second passivation layer 170 may be formed of a solder resist.

The adhesive member 175 is disposed under the lower conductive layer 150 exposed through the opening of the second passivation layer 170. The adhesive member 175 is a member for soldering.

The adhesive member 175 provides an adhesive force between the printed circuit board 100 and the external substrate. The adhesive member 175 may be formed of a solder ball, or alternatively may be formed by using an adhesive paste or a copper core solder ball.

In addition, the adhesive paste may be formed of a conductive material for electrical conduction, and at this point, when the adhesive paste is formed of the conductive material, the adhesive paste may preferably be formed of a conductive material selected from the group consisting of copper, silver, gold, aluminum, carbon nanotubes, and combinations thereof.

Hereinafter, the first pad 120, the second pad 140, the upper conductive layer 130, and the lower conductive layer 150 will be described in more detail.

Figure 3:
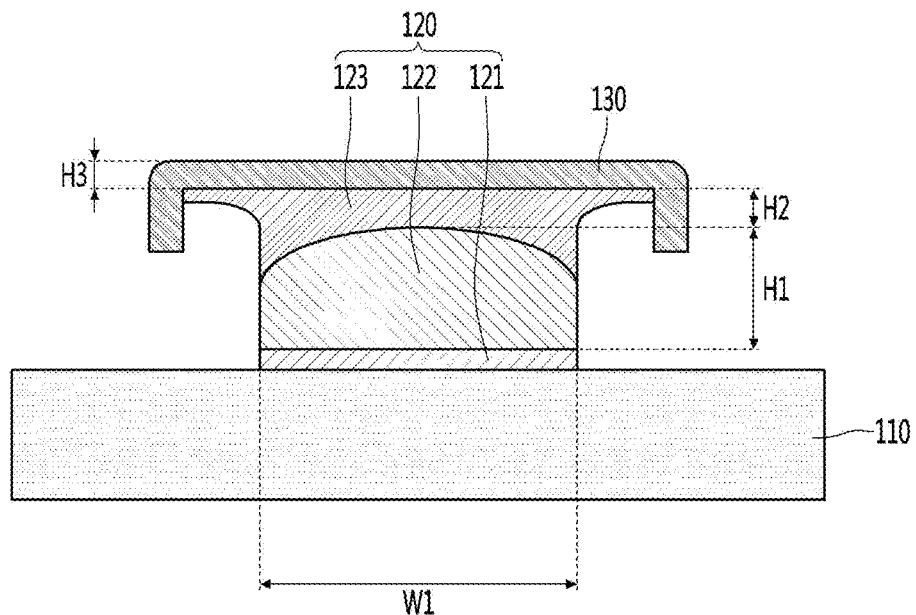
FIG. 3 is a view specifically illustrating a first pad 120 and an upper conductive layer 130 shown in FIG. 2
Figure 4:
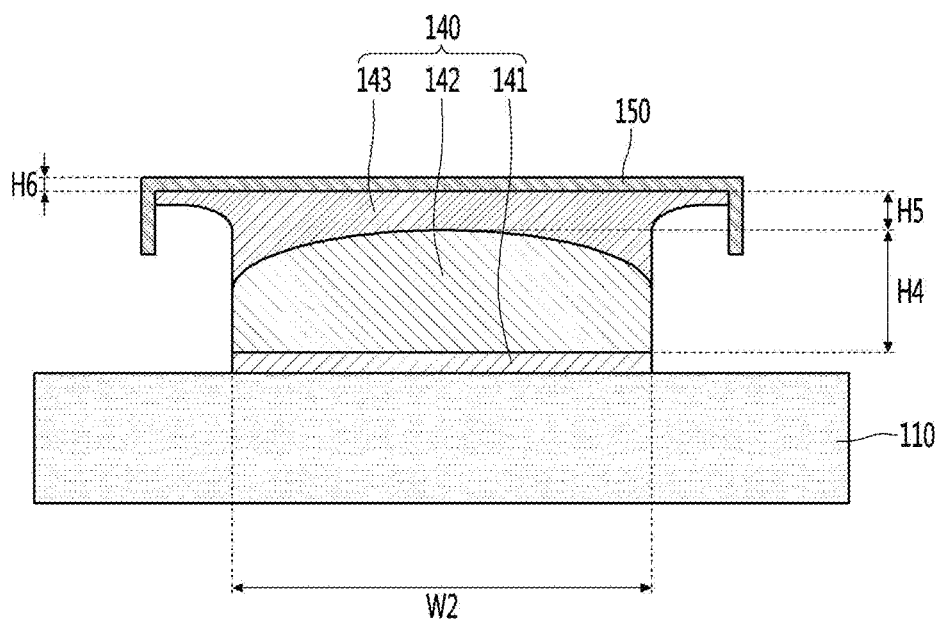
FIG. 4 is a view specifically illustrating a second pad 140 and a lower conductive layer 150 shown in FIG. 2.

FIG. 3 is a view specifically illustrating the first pad 120 and the upper conductive layer 130 shown in FIG. 2, and FIG. 4 is a view specifically illustrating the second pad 140 and the lower conductive layer 150 shown in FIG. 2.

Referring to FIGS. 3 and 4, the upper conductive layer 130 and the lower conductive layer 150 have an overhang structure with respect to the first pad 120 and the second pad 140, respectively.

First, referring to FIG. 3, the first pad 120 is disposed on the insulating layer disposed at the uppermost portion of the plurality of insulating layers.

The first pad 120 includes a plating seed layer 121 disposed on the uppermost insulating layer, a first-first pattern 122 disposed on the plating seed layer 121, and a first-second pattern 123 disposed on the first-first pattern 122. In addition, the upper conductive layer 130 is disposed on the first-second pattern 123.

The plating seed layer 121 is disposed on the uppermost insulating layer. Preferably, a lower surface of the plating seed layer 121 is in direct contact with an upper surface of the uppermost insulating layer. The upper and lower surfaces of the plating seed layer 121 has the same width.

In other words, a width of the upper surface of the plating seed layer 121 refers to an actual length from one end of the upper surface of the plating seed layer 121 to the other end thereof, and a width of the lower surface of the plating seed layer 121 refers to an actual length from one end of the lower surface of the plating seed layer 121 to the other end thereof. Accordingly, a width described below may be defined as an actual length from one end to the other end as described above.

In addition, a horizontal cross section of the plating seed layer 121 may have any one of various shapes such as a circular shape, a square shape, a triangle shape, an ellipse shape, a fan shape, and a star shape.

The plating seed layer 121 may be a seed layer for electrolytic plating of the first-first pattern 122 and the first-second pattern 123 and may be also a seed layer for electrolytic plating of the upper conductive layer 130. In other words, the upper conductive layer 130 as well as the first-first pattern 122 and the first-second pattern 123 may be formed by electrolytic-plating the plating seed layer 121 as a seed layer.

A circuit pattern part is disposed on the plating seed layer 121. The circuit pattern part includes a first-first pattern 122 and a first-second pattern 123. The first-first pattern 122 and the first-second pattern 123 are formed of the same metal material. Preferably, the first-first pattern 122 and the first-second pattern 123 may be formed of copper (Cu), or may further include a conductive metal material while including the copper (Cu).

The first-first pattern 122 is formed on the plating seed layer 121. An upper surface of the first-first pattern 122 has a curvature. Accordingly, a width of a lower surface of the first-first pattern 122 is different from that of the upper surface of the first-first pattern 122. Here, the width refers to the actual length from one end to the other end as described above, and since the upper surface of the first-first pattern 122 has a curvature, the width (actual length) of the upper surface of the first-first pattern 122 is larger than that (actual length) of the lower surface of the first-first pattern 122. At this point, a straight line distance from one end to the other end of the upper surface of the first-first pattern 122 is the same as a straight line distance from one end to the other end of the lower surface of the first-first pattern 122.

The first-second pattern 123 is disposed on the first-first pattern 122. The first-second pattern 123 is disposed to cover the upper surface of the first-first pattern 122. Accordingly, a lower surface of the first-second pattern 123 has a curvature corresponding to the upper surface of the first-first pattern 122. In other words, the upper surface of the first-first pattern 122 may have a convex shape that protrudes upward. In addition, the lower surface of the first-second pattern 123 may have a concave shape that is recessed inward to cover the upper surface of the convex first-first pattern 122.

The first-second pattern 123 is disposed to fill a removed edge region of the first-first pattern 122. Therefore, at least a part of the lower surface of the first-second pattern 123 is located to be lower than at least a part of the upper surface of the first-first pattern 122. At this point, the first-second pattern 123 covers the entire upper surface of the first-first pattern 122. Therefore, the lower surface of the first-second pattern 123 is formed such that at least a part of a portion in contact with the upper surface of the first-first pattern 122 is located to be lower than at least a part of the upper surface of the first-first pattern 122.

Accordingly, an outer side portion of the lower surface of the first-second pattern 123 is located to be lower than a remaining central portion of the upper surface of the first-first pattern 122 except for an outer side portion thereof. That is, an outermost side portion of the lower surface of the first-second pattern 123 is located to be lower than the remaining central portion of the upper surface of the first-first pattern 122 except for the outer side portion thereof.

Further, the outermost side portion of the lower surface of the first-second pattern 123 and an outermost side portion of the upper surface of the first-first pattern 122 are located to be lower than the remaining central portion of the upper surface of the first-first pattern 122 except for the outer side portion thereof.

Furthermore, the outermost side portion of the lower surface of the first-second pattern 123 and the outermost side portion of the upper surface of the first-first pattern 122 are located to be lower than both the remaining central portion of the upper surface of the first-first pattern 122 except for the outer side portion thereof and a remaining central portion of the lower surface of the first-second pattern 123 except for the outer side portion thereof.

In addition, a thickness of the outer side portion of the first-second pattern 123 is larger than that of the central portion of the first-second pattern 123.

Accordingly, a distance from the outer side portion of the lower surface of the first-second pattern 123 to the uppermost insulating layer in a first direction perpendicular to the upper surface of the uppermost insulating layer is smaller than that from the central portion except for the outer side portion of the lower surface of the first-second pattern 123 to the uppermost insulating layer.

In addition, a thickness of the first-second pattern 123 gradually increases toward the outer side portion of the first-second pattern 123 from the central portion thereof. On the contrary, a thickness of the first-first pattern 122 gradually decreases toward the outer side portion of the first-first pattern 122 from the central portion thereof.

In addition, a width of the first-second pattern 123 may gradually increase toward an upper portion thereof. In other words, at least a part of a side surface of the first-second pattern 123 protrudes in a longitudinal direction than a side surface of the first-first pattern 122. In other words, at least a part of a left-side surface of the first-second pattern 123 includes a portion that further protrudes in a left-side longitudinal direction than a left-side surface of the first-first pattern 122. Further, at least a part of a right-side surface of the first-second pattern 123 includes a portion that further protrudes in a right-side longitudinal direction than a right-side surface of the first-first pattern 122.

Meanwhile, the first-first pattern 122 may have a first height H1 and the first-second pattern 123 may have a second height H2. Here, the height may refer to a thickness of each of the plating seed layer 121, the first-first pattern 122, and the first-second pattern 123 in a vertical direction.

The height of the plating seed layer 121 is lower than the first height H1 of the first-first pattern 122. That is, the thickness of the plating seed layer 121 is thinner than that of the first-first pattern 122.

Furthermore, the first height H1 of the first-first pattern 122 may be higher than the second height H2 of the first-second pattern 123. In other words, the thickness of the first-first pattern 122 is thicker than that of the first-second pattern 123.

At this point, the thickness of the first-second pattern 123 may be in a range of 1 to 13 μm. Preferably, the thickness of the first-second pattern 123 may be in a range of 3 to 10 μm. More preferably, the thickness of the first-second pattern 123 may be in a range of 3 to 6 μm.

That is, when the thickness of the first-second pattern 123 is more than 1 μm, an overspreading phenomenon of the upper conductive layer according to the present invention may be inhibited, and when the height of the first-second pattern 123 is in a range from 3 to 6 μm, an overhang portion of the upper conductive layer 130 may be minimized and the overspreading phenomenon of the upper conductive layer 130 may be inhibited completely. Here, the overspreading phenomenon may include a phenomenon in which the metal of the upper conductive layer 130 spreads into the first-second pattern 123 of the underlying layer in the plating process of the upper conductive layer 130. In addition, the overspreading phenomenon may include a phenomenon in which a metal material constituting the upper conductive layer 130 penetrates into a space between a mask and the first-second pattern 123 in the plating process of the upper conductive layer 130.

The upper conductive layer 130 is disposed on the first-second pattern 123. At this point, the upper conductive layer 130 includes a non-contact region not in contact with the first pad 120 and a contact region in contact with the first pad 120.

In other words, the upper conductive layer 130 includes a contact region in which the upper conductive layer 130 is in contact with at least one of the plating seed layer 121, the first-first pattern 122, and the first-second pattern 123. At this point, the contact region of the upper conductive layer 130 may be in contact with the first-second pattern 123. In other words, a lower surface of the upper conductive layer 130 includes a contact portion in which the lower surface of the upper conductive layer 130 is in contact with an upper surface of the first-second pattern 123 and the side surface of the first-second pattern 123.

In addition, the upper conductive layer 130 is spaced apart from the plating seed layer 121, the first-first pattern 122 and the first-second pattern 123, and includes a non-contact region in which the upper conductive layer 130 is not in contact with all of the plating seed layer 121, the first-first pattern 122, and the first-second pattern 123. In other words, the lower surface of the upper conductive layer 130 includes a non-contact portion which is floating in air as the lower surface of the upper conductive layer 130 is not in contact with the plating seed layer 121, the first-first pattern 122, and the first-second pattern 123. At this point, the non-contact portion of the lower surface of the upper conductive layer 130 may be an outer side portion of the lower surface of the upper conductive layer 130. Further, the contact portion of the lower surface of the upper conductive layer 130 may be a remaining central portion of the lower surface of the upper conductive layer 130 except for the outer side portion of the lower surface thereof.

As described above, the upper conductive layer 130 is not disposed only at the upper surface of the first-second pattern 123, but is bent at least once and disposed also at the side surface of the first-second pattern 123. In addition, an end portion of a portion of the upper conductive layer 130 which is disposed at the side surface of the first-second pattern 123 is spaced apart from the first-second pattern 123. As a result, the upper conductive layer 130 has an overhang structure and is disposed on the first pad 120, more specifically, on the first-second pattern 123.

Meanwhile, a width of the non-contact portion of the upper conductive layer 130 may be in a range of 3 to 7 µm. Preferably, the width of the non-contact portion of the upper conductive layer 130 may be in a range of 3 to 4 µm. Here, the width of the non-contact portion may refer to a thickness (or length, height, or width) in a longitudinal direction of the non-contact portion in the drawing.

Meanwhile, a height H3 of the upper conductive layer 130 may be determined by characteristics required in the upper conductive layer 130. In other words, a thickness of the upper conductive layer 130 is determined by a function of the first pad 120 disposed under the upper conductive layer 130.

Here, the first pad 120 is formed for wire bonding in which the wire 195 electrically connected to the electronic component 190 is bonded. Therefore, the upper conductive layer 130 should have a thickness sufficient to satisfy the wire-bonding characteristics. Accordingly, the upper conductive layer 130 may have a thickness that satisfies a range of 0.2 to 0.8 µm. At this point, when the upper conductive layer 130 has a thickness of less than 0.2 µm, it may not meet criteria required for BPT (BPT specification 5 g or more) after wire bonding. In addition, when the upper conductive layer 130 has a thickness of more than 0.8 µm, there is a problem that a material cost due to excessive use of gold (Au) forming the upper conductive layer 130 is increased. Therefore, in the present invention, the upper conductive layer 130 has a thickness that satisfies the range of 0.2 to 0.8 µm. Here, the thickness of the upper conductive layer 130 may refer to a thickness of the upper conductive layer 130 in a lateral direction.

Meanwhile, as described above, the upper conductive layer 130 of the present invention includes only a layer including gold (Au). In other words, the upper conductive layer 130 including gold is directly disposed on the first-second pattern 123 formed of a metal including the copper.

That is, in the present invention, a nickel layer disposed between a copper layer and gold (Au) of a typical conventional upper conductive layer is removed. This is because, as the first-second pattern 123 is formed on the first-first pattern 122, the overspreading phenomenon of the upper conductive layer 130 (which is clearly described above) may be solved, and the upper conductive layer 130 is formed of the plating seed layer 121 as a seed layer, which is used at the time of forming the first-first pattern 122 and the first-second pattern 123.

At this point, typical copper has so high electrical conductivity as compared with nickel. That is, the electrical conductivity of the nickel is only about 14.9% of the electrical conductivity of the copper. Therefore, in the present invention, since the first-second pattern 123 instead of the nickel layer is formed, a gold (Au) layer may be directly formed on a copper layer, and thus all of reliability problems caused by the formation of the nickel can be solved. In other words, in the related art, there was a problem in the interface characteristics between the first-first pattern 122 and the nickel layer due to the difference in characteristics between metals occurring between copper and nickel, and there was a problem that the electrical conductivity due to the nickel layer was lowered. However, in the present invention, an upper conductive layer including gold (Au) is formed by using a plating seed layer used at the time of forming the first-first pattern and the first-second pattern, so that a nickel (Ni) seed layer which has served as a seed layer of a gold (Au) conductive layer in the related art may be removed, and thus, not only a thickness of a printed circuit board product can be reduced, but also economic efficiency of a product can be improved by technical effect due to efficiency of a process. Further, according to an embodiment of the present invention, a nickel layer may be removed from a pattern structure, and thus not only electrical conductivity of a pattern can be improved, but also a problem of interface property occurring between copper and nickel constituting the pattern can be solved.

Meanwhile, referring to FIG. 4, the second pad 140 is disposed under the insulating layer disposed at the lowermost portion of the plurality of insulating layers. At this point, as shown in FIG. 4, the lower conductive layer 150 is disposed on the second pad 140, but FIG. 4 substantially illustrates a state in which an actual product is turned upside down. Hereinafter, for convenience of explanation, it is assumed that the second pad 140 is formed on the lowermost insulating layer among the plurality of insulating layers. But, in reality, the second pad 140 is disposed under a lower surface of the lowermost insulating layer, and the lower conductive layer 150 is disposed under the second pad 140.

The second pad 140 includes a plating seed layer 141 disposed on the lowermost insulating layer, a second-first pattern 142 disposed on the plating seed layer 141, and a second-second pattern 143 disposed on the second-first pattern 142. In addition, the lower conductive layer 150 is disposed on the second-second pattern 143.

The plating seed layer 141 is disposed on the lowermost insulating layer. Preferably, a lower surface of the plating seed layer 141 is in direct contact with an upper surface of the lowermost insulating layer. The upper and lower surfaces of the plating seed layer 141 has the same width.

The plating seed layer 141 may be a seed layer for electrolytic plating of the second-first pattern 142 and the second-second pattern 143 and may be also a seed layer for electrolytic plating of the lower conductive layer 150. In other words, the lower conductive layer 150 as well as the second-first pattern 142 and the second-second pattern 143 may be formed by electrolytic-plating the plating seed layer 141 as a seed layer.

A circuit pattern part of the second pad 140 is disposed on the plating seed layer 141. The circuit pattern part includes a second-first pattern 142 and a second-second pattern 143. The second-first pattern 142 and the second-second pattern 143 are formed of the same metal material. Preferably, the second-first pattern 142 and the second-second pattern 143 may be formed of copper (Cu), or may further include a conductive metal material while including the copper (Cu).

The second-first pattern 142 is formed on the plating seed layer 141. An upper surface of the second-first pattern 142 has a curvature. Accordingly, a width of a lower surface of the second-first pattern 142 is different from that of the upper surface of the second-first pattern 142. Here, the width refers to the actual length from one end to the other end as described above, and since the upper surface of the second-first pattern 142 has a curvature, the width (actual length) of the upper surface of the second-first pattern 142 is larger than that (actual length) of the lower surface of the second-first pattern 142. At this point, a straight line distance from one end to the other end of the upper surface of the second-first pattern 142 is the same as a straight line distance from one end to the other end of the lower surface of the second-first pattern 142.

The second-second pattern 143 is disposed on the second-first pattern 142. The second-second pattern 143 is disposed to cover the upper surface of the second-first pattern 142. Accordingly, a lower surface of the second-second pattern 143 has a curvature corresponding to the upper surface of the second-first pattern 142. In other words, the upper surface of the second-first pattern 142 may have a convex shape that protrudes upward. In addition, the lower surface of the second-second pattern 143 may have a concave shape that is recessed inward to cover the upper surface of the convex second-first pattern 142.

The second-second pattern 143 is disposed to fill a removed edge region of the second-first pattern 142. Therefore, at least a part of the lower surface of the second-second pattern 143 is located to be lower than at least a part of the upper surface of the second-first pattern 142. At this point, the second-second pattern 143 covers the entire upper surface of the second-first pattern 142. Therefore, the lower surface of the second-second pattern 143 is formed such that at least a part of a portion in contact with the upper surface of the second-first pattern 142 is located to be lower than at least a part of the upper surface of the second-first pattern 142.

Accordingly, an outer side portion of the lower surface of the second-second pattern 143 is located to be lower than a remaining central portion of the upper surface of the second-first pattern 142 except for an outer side portion thereof. That is, an outermost side portion of the lower surface of the second-second pattern 143 is located to be lower than the remaining central portion of the upper surface of the second-first pattern 142 except for the outer side portion thereof.

In addition, the outermost side portion of the lower surface of the second-second pattern 143 and an outermost side portion of the upper surface of the second-first pattern 142 are located to be lower than the remaining central portion of the upper surface of the second-first pattern 142 except for the outer side portion thereof.

Further, the outermost side portion of the lower surface of the second-second pattern 143 and the outermost side portion of the upper surface of the second-first pattern 142 are located to be lower than both the remaining central portion of the upper surface of the second-first pattern 142 except for the outer side portion thereof and a remaining central portion of the lower surface of the second-second pattern 143 except for the outer side portion thereof.

In addition, a thickness of the outer side portion of the second-second pattern 143 is larger than that of the central portion of the second-second pattern 143.

Accordingly, a distance from the outer side portion of the lower surface of the second-second pattern 143 to the lowermost insulating layer in the first direction perpendicular to the upper surface of the lowermost insulating layer is smaller than that from the central portion except for the outer side portion of the lower surface of the second-second pattern 143 to the lowermost insulating layer.

In addition, a thickness of the second-second pattern 143 gradually increases toward the outer side portion of the second-second pattern 143 from the central portion thereof. On the contrary, a thickness of the second-first pattern 142 gradually decreases toward the outer side portion of the second-first pattern 142 from the central portion thereof.

In addition, a width of the second-second pattern 143 may gradually increase toward an upper portion thereof. In other words, at least a part of a side surface of the second-second pattern 143 protrudes in a longitudinal direction than a side surface of the second-first pattern 142. In other words, at least a part of a left-side surface of the second-second pattern 143 includes a portion that further protrudes in a left-side longitudinal direction than a left-side surface of the second-first pattern 142. Further, at least a part of a right-side surface of the second-second pattern 143 includes a portion that further protrudes in a right-side longitudinal direction than a right-side surface of the second-first pattern 142.

Meanwhile, the second-first pattern 142 may have a fourth height H4 and the second-second pattern 143 may have a fifth height H5. Here, the height may refer to a thickness of each of the plating seed layer 141, the second-first pattern 142, and the second-second pattern 143 in a vertical direction.

The height of the plating seed layer 141 is lower than the fourth height H4 of the second-first pattern 142. That is, the thickness of the plating seed layer 141 is thinner than that of the second-first pattern 142.

Furthermore, the fourth height H4 of the second-first pattern 142 may be higher than the fifth height H5 of the second-second pattern 143. In other words, the thickness of the second-first pattern 142 is thicker than that of the second-second pattern 143.

At this point, the thickness of the second-second pattern 143 may be in a range of 1 to 13 μm. Preferably, the thickness of the second-second pattern 143 may be in a range of 3 to 10 μm. More preferably, the thickness of the second-second pattern 143 may be in a range of 3 to 6 μm.

That is, when the height of the second-second pattern 143 is more than 1 μm, an overspreading phenomenon of the lower conductive layer according to the present invention may be inhibited, and when the height of the second-second pattern 143 is in a range from 3 to 6 μm, an overhang portion of the lower conductive layer 150 may be minimized and the overspreading phenomenon of the lower conductive layer 150 may be inhibited completely. Here, the overspreading phenomenon may include a phenomenon in which the metal of the lower conductive layer 150 spreads into the second-second pattern 143 of the underlying layer in the plating process of the lower conductive layer 150. In addition, the overspreading phenomenon may include a phenomenon in which a metal material constituting the lower conductive layer 150 penetrates into a space between a mask and the second-second pattern 143 in the plating process of the lower conductive layer 150.

The lower conductive layer 150 is disposed on the second-second pattern 143. At this point, the lower conductive layer 150 includes a non-contact region not in contact with the second pad 140 and a contact region in contact with the second pad 140.

In other words, the lower conductive layer 150 includes a contact region in which the lower conductive layer 150 is in contact with at least one of the plating seed layer 141, the second-first pattern 142, and the second-second pattern 143. At this point, the contact region of the lower conductive layer 150 may be in contact with the second-second pattern 143. In other words, a lower surface of the lower conductive layer 150 includes a contact portion in which the lower surface of the lower conductive layer 150 is in contact with an upper surface of the second-second pattern 143 and the side surface of the second-second pattern 143.

Further, the lower conductive layer 150 is spaced apart from the plating seed layer 141, the second-first pattern 142 and the second-second pattern 143, and includes a non-contact region in which the lower conductive layer 150 is not in contact with all of the plating seed layer 141, the second-first pattern 142, and the second-second pattern 143. In other words, the lower surface of the lower conductive layer 150 includes a non-contact portion which is floating in air as the lower surface of the lower conductive layer 150 is not in contact with the plating seed layer 141, the second-first pattern 142, and the second-second pattern 143. At this point, the non-contact portion of the lower surface of the lower conductive layer 150 may be an outer side portion of the lower surface of the lower conductive layer 150. Furthermore, the contact portion of the lower surface of the lower conductive layer 150 may be a remaining central portion of the lower surface of the lower conductive layer 150 except for the outer side portion of the lower surface thereof.

As described above, the lower conductive layer 150 is not disposed only at the upper surface of the second-second pattern 143, but is bent at least once and disposed also at the side surface of the second-second pattern 143. In addition, an end portion of a portion of the lower conductive layer 150 which is disposed at the side surface of the second-second pattern 143 is spaced apart from the second-second pattern 143. As a result, the lower conductive layer 150 has an overhang structure and is disposed on the second pad 140, more specifically, on the second-second pattern 143.

Meanwhile, a width of the non-contact portion of the lower conductive layer 150 may be in a range of 2 to 6 μm.

Preferably, the width of the non-contact portion of the lower conductive layer 150 may be in a range of 2 to 3 μm.

Here, the width of the non-contact portion of the lower conductive layer 150 may refer to a thickness (or length, height, or width) in a longitudinal direction in the drawing.

At this point, a thickness of the lower conductive layer 150 and the thickness of the upper conductive layer 130 are different from each other. Accordingly, the width of the non-contact portion in the lower conductive layer 150 is different from that of the non-contact portion in the upper conductive layer 130. Preferably, the upper conductive layer 130 is thicker than the lower conductive layer 150 so that the width of the non-contact portion in the lower conductive layer 150 may be smaller than that of the non-contact portion in the upper conductive layer 130.

In other words, each of the upper conductive layer 130 and the lower conductive layer 150 may include a first region in direct contact with an upper surface of the first or second pad, a second region extending from the first region and in direct contact with a side surface of the first or second pad, and a third region extending from the second region and spaced from the first and second pads.

Further, the thickness of the upper conductive layer 130 in the longitudinal direction of the first region may be greater than that of the lower conductive layer 150 in the longitudinal direction of the first region. Furthermore, the thickness of the upper conductive layer 130 in the lateral direction of the second region may be greater than that of the lower conductive layer 150 in the lateral direction of the second region.

In addition, an end portion of the third region of the upper conductive layer 130 is located to be higher than the outer side region of the upper surface of the first-first pattern constituting the first pad, and an end portion of the third region of the lower conductive layer 150 is located to be lower than the outer side region of the lower surface of the second-first pattern constituting the second pad.

Furthermore, the thickness of the upper conductive layer 130 in the longitudinal direction of the third region may be different from that of the lower conductive layer 150 in the longitudinal direction of the third region.

In the present invention, the thickness of the third region in the upper conductive layer or the lower conductive layer may be minimized by the difference in thickness, and thus a problem occurring due to the third region deviated from the second region can be minimized.

Meanwhile, a height H6 of the lower conductive layer 150 may be determined by characteristics required in the lower conductive layer 150. In other words, the thickness of the lower conductive layer 150 is determined by a function of the second pad 140 disposed under the lower conductive layer 150.

At this point, the second pad 140 is formed for soldering bonding to be bonded to an external substrate. Therefore, the lower conductive layer 150 should have a thickness sufficient to satisfy the soldering characteristics. Accordingly, the lower conductive layer 150 may have a thickness that satisfies a range of 0.05 to 0.3 μm. At this point, when the lower conductive layer 150 has a thickness of less than 5 μm, the second-second pattern which is an underlying layer may be exposed. In addition, when the lower conductive layer 150 has a thickness of more than 0.3 μm, there is a problem that a material cost due to excessive use of gold (Au) forming the lower conductive layer 150 is increased. Therefore, in the present invention, the lower conductive layer 150 has a thickness that satisfies a range of 0.05 to 0.3 μm. Meanwhile, in the range of the thickness of the lower conductive layer 150, the thickness of the upper conductive layer 130 is included. At this point, even though some values in the thickness range overlap, the thicknesses of the lower conductive layer 150 and the upper conductive layer 130 are formed to be different from each other. For example, when the thickness of the lower conductive layer 150 is 0.3 μm, the upper conductive layer 130 may have a thickness in a range of 0.31 to 0.8 μm which is larger than 0.3 μm but not in a range of 0.2 to 0.8 μm.

Meanwhile, as described above, the lower conductive layer 150 of the present invention includes only a layer including gold (Au). In other words, the lower conductive layer 150 including gold is directly disposed on the second-second pattern 143 formed of a metal including the copper.

Meanwhile, as described above, the upper conductive layer 130 and the lower conductive layer 150 are formed of the same metal material and formed in the same process, but have different thicknesses. In other words, the upper conductive layer 130 formed on the first pad 120 formed for wire bonding is thicker than the lower conductive layer 150 formed on the second pad 140 formed for soldering.

At this point, in the present invention, the upper conductive layer 130 and the lower conductive layer 150 are introduced into one plating tank, and accordingly, the plating process is performed at both surfaces of the insulating substrate 110 simultaneously, so that the upper conductive layer 130 and the lower conductive layer 150 having different thicknesses are formed.

Meanwhile, the overhang structure of the upper metal layer shown in FIGS. 3 and 4 is merely an embodiment, and the structure of the overhang may be variously modified.

Figure 5:
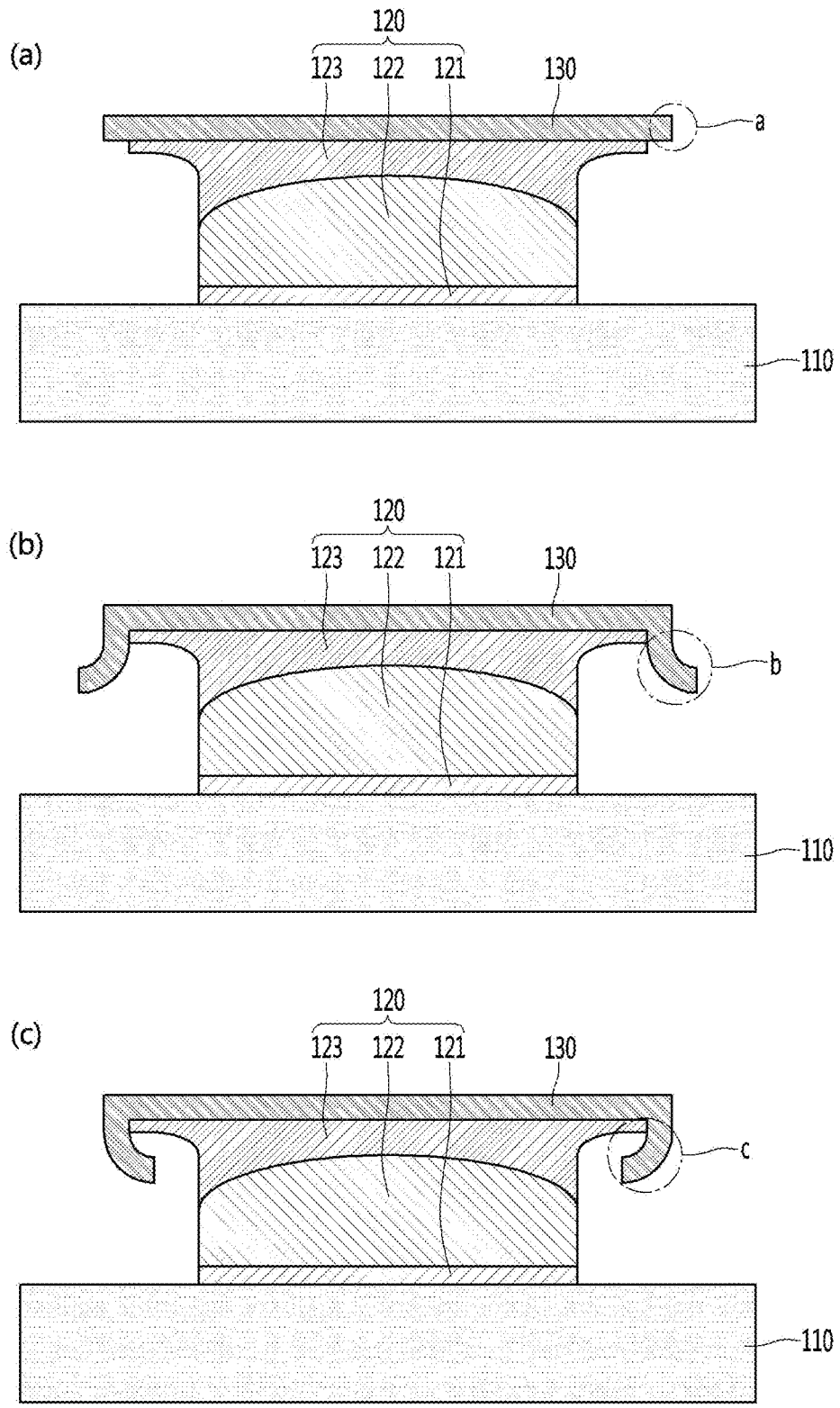
FIGS. 5(a)-5(c) are views illustrating a modified example of an overhang structure shown in FIGS. 3 and 4.

FIGS. 5(a)-5(c) are views illustrating a modified example of an overhang structure shown in FIGS. 3 and 4.

Referring to FIGS. 5(a)-5(c), the lower surface of the upper conductive layer 130 may be in contact with only the upper surface of the first-second pattern 123. In other words, in FIG. 3, the upper conductive layer 130 is in contact with not only the upper surface of the first-second pattern 123 but also the side surface thereof. But, as shown in FIG. 5(a), the lower surface of the upper conductive layer 130 may be in contact with only the upper surface of the first-second pattern 123, and accordingly, the lower surface of the upper conductive layer 130 may extend in a direction parallel to the upper surface of the first-second pattern 123.

In addition, as shown in FIG. 5(b), the lower surface of the upper conductive layer 130 may be in contact with both the upper surface and the side surface of the first-second pattern 123. However, the non-contact region of the upper conductive layer 130 may have a shape that is not extended in a direction perpendicular to the upper surface of the upper conductive layer 130, but is bent in an outward direction.

Further, as shown in FIG. 5(c), the lower surface of the upper conductive layer 130 may be in contact with both the upper surface and the side surface of the first-second pattern 123. However, the non-contact region of the upper conductive layer 130 may have a shape that is not extended in a direction perpendicular to the upper surface of the upper conductive layer 130, but is bent in an inward direction.

Although the upper conductive layer 130 and the lower conductive layer 150 are formed simultaneously in the related art, the upper conductive layer 130 and the lower conductive layer 150 have the same thickness due to a manufacturing process problem. This is because an adsorption amount of gold ions, which is the metal material forming each of the conductive layers, did not react to a current change. In other words, in the related art, the insulating substrate 110 was vertically introduced in a vertical plating tank, so that upper and lower surfaces of the insulating substrate 110 were respectively plated.

At this point, a space for plating at the upper surface of the insulating substrate 110 in the plating tank and a space for plating at the lower surface of the insulating substrate 110 were connected to each other, so that a plating solution was freely moved between the upper surface region and the lower surface region. Accordingly, even though the plating current for the upper surface and the plating current for the lower surface were differently applied to each other, due to high conductivity of gold plating solution and limitation of a rack equipment mechanism of a plating apparatus, it was indicated that an adsorption amount of gold ions formed in each of regions was similar, so that it was difficult to control the upper conductive layer 130 and the lower conductive layer 150 to a desired thickness.

Meanwhile, as described above, in the conventional plating apparatus, when plating is performed with a plating solution of copper (Cu) or nickel (Ni) instead of gold (Au), since conductivity and ion-mobility of the copper or nickel are remarkably lower than those of gold, it is difficult to form different plating layers at both surfaces even in the open state as described above.

However, when gold is plated, there is a situation where ions transfer to an opposite surface at different current densities due to mobility and high conductivity of the gold ions, so that the upper conductive layer 130 and the lower conductive layer 150, which are formed at the both surfaces, have the same thickness.

In addition, as described above, since an area of the first pad 120 is narrower than that of the second pad 140 and an plating area with respect to the second pad 140 is larger than that of the first pad 120, in the related art, when the same current density is applied in the plating process, a current with respect to the second pad 140 having a large area flows toward the first pad 120 having the small area, and as a result, a conductive layer having the same thickness is formed at the first pad 120 and the second pad 140.

On the other hand, in the present invention, the upper conductive layer 130 and the lower conductive layer 150 are formed by a new method, so that the upper conductive layer 130 and the lower conductive layer 150 may be formed to have different thicknesses even by simultaneously plating both surfaces of the insulating substrate 110.

Figure 6:
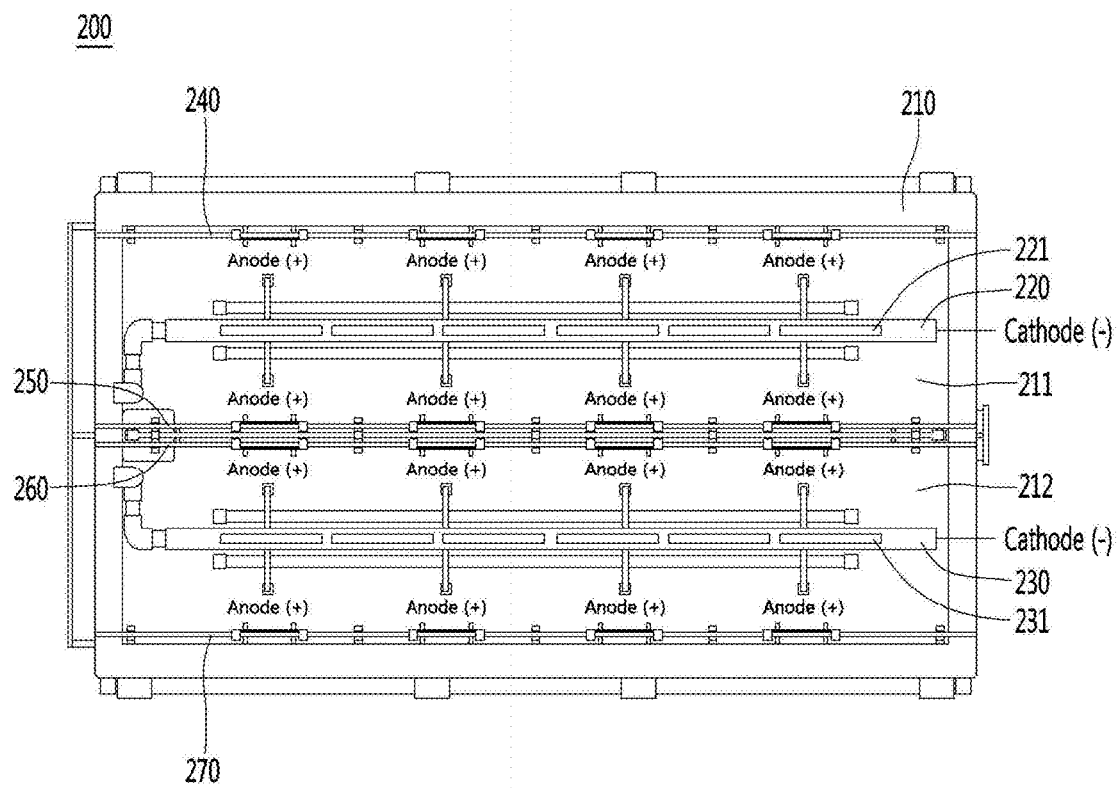
FIG. 6 is a view illustrating a plating apparatus according to an embodiment of the present invention.
Figure 7:
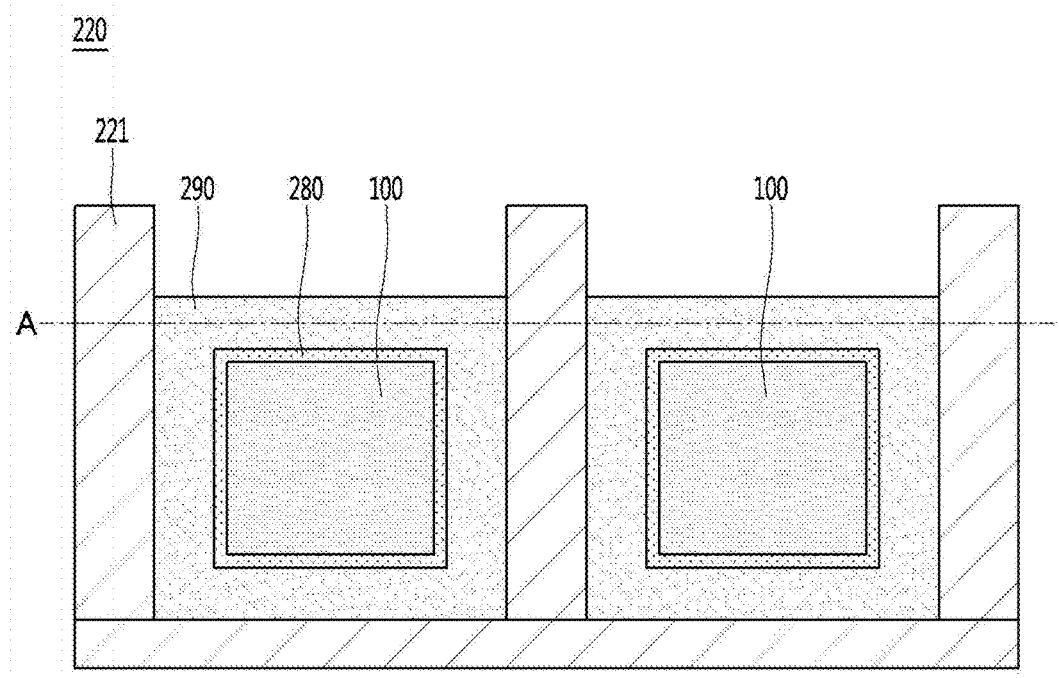
FIG. 7 is a view illustrating a detailed structure of a substrate support of the plating apparatus shown in FIG. 6.
Figure 8:
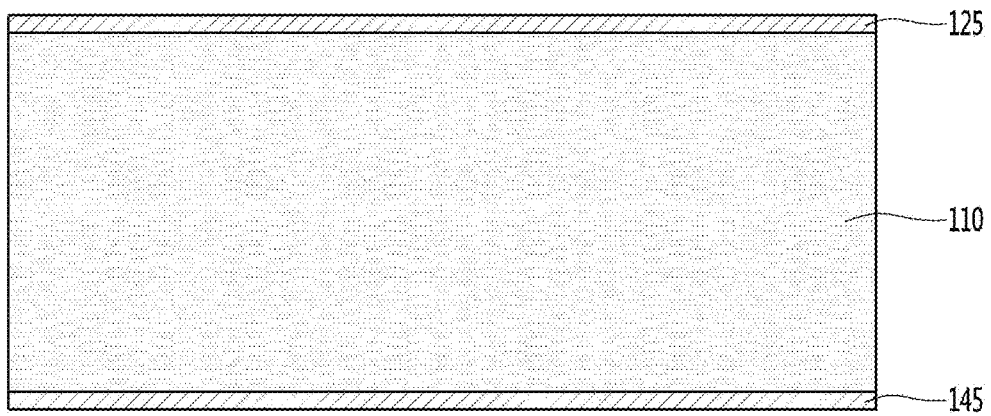
FIGS. 8 to 15 are views for explaining a process sequence of a method of manufacturing a printed circuit board according to an embodiment of the present invention.

FIG. 6 is a view illustrating a plating apparatus according to an embodiment of the present invention, and FIG. 7 is a view illustrating a detailed structure of a substrate support of the plating apparatus shown in FIG. 6.

Referring to FIG. 6, a plating apparatus 200 includes a plating tank 210 in which a gold plating solution is accommodated, a plurality of electrodes 240, 250, 260 and 270, a first pedestal 220 and a second pedestal 230.

A gold (Au) plating solution is accommodated in the plating tank 210. In addition, the inside of the plating tank 210 is divided into a first plating space 211 and a second plating space 212. In addition, the plurality of electrodes include a first anode electrode 240 for plating the upper surface of at least one substrate which is introduced into the first plating space 211 and a second anode electrode 250 for plating the lower surface of at least one substrate which is introduced into the first plating space 211. In addition, a cathode electrode for plating a substrate which is introduced into the first plating space 211 is disposed in the first pedestal 220.

In addition, the plurality of electrodes include a third anode electrode 260 for plating the upper surface of at least one substrate which is introduced into the second plating space 212 and a fourth anode electrode 270 for plating the lower surface of at least one substrate which is introduced into the second plating space 212. In addition, a cathode electrode for plating a substrate which is introduced into the second plating space 212 is disposed in the second pedestal 230.

Meanwhile, a first insertion part 221 capable of inserting at least one substrate vertically is formed in the first pedestal 220. Further, a second insertion part 231 capable of inserting at least one substrate vertically is formed also in the second pedestal 230.

Furthermore, a substrate for plating is vertically inserted into each of the first insertion part 221 and the second insertion part 231, so that a plating process with respect to the upper and lower surfaces of the substrate is performed.

At this point, the plating process with respect to the upper and lower surfaces of the substrate may be sequentially performed, or alternatively, the plating process may be performed simultaneously. Meanwhile, in the present invention, a current supplied to the first anode electrode 240 and the third anode electrode 260 and a current supplied to the second anode electrode 250 and the fourth anode electrode 270 are different from each other. At this point, in the related art, the plating solution was freely moved in the first pedestal 220 and the second pedestal 230, and even though a current control was performed as described above, the thicknesses of plating at the upper and lower surfaces were equal to each other.

In addition, a width of the first pad 120 and a width of the second pad 140 are different from each other. Preferably, since the first pad 120 is used for wire bonding, the first pad 120 may be formed to have a width sufficient to secure a wire-bonding space, and the second pad 140 should have a sufficient space in which the adhesive member 175 may be disposed. Therefore, the first pad 120 has a first width and the second pad 140 has a second width, and at this point, the first width is narrower than the second width. In other words, since the first pad 120 and the second pad 140 have different widths, in the related art, it is difficult to form a conductive layer having a desired thickness on the first pad 120 and the second pad 140, respectively.

However, in the present invention, the plating process proceeds in an independent space (a separated space blocked by the pedestal) with respect to the upper and lower surfaces of the substrate, so that it is possible to precisely control a desired thickness through the current control.

Referring to FIG. 7, a first insertion part into which the substrate 100 is inserted is formed in the first pedestal 220, and the substrate 100 is inserted into the formed insertion part.

At this point, a first sealing part 280 surrounds a region into which the substrate is inserted, and a blocking part 290 for separating the left and right regions of the first pedestal 220 is also formed at a periphery of the first sealing part 280. At this point, the blocking part 290 is formed at a higher position than the plating solution supplied into the plating tank.

Accordingly, the first sealing part 280 and the blocking part 290 surround the space around the substrate inserted into the first pedestal 220, so that the upper and lower surfaces of the inserted substrate may be plated by using independent spaces, that is, separate plating solutions.

Therefore, in the present invention, current density conditions for plating at the upper surface of the substrate and current density conditions for plating at the lower surface of the substrate are applied differently, so that the plating is proceeded at an exact thickness required by each of the conductive layers.

According to an embodiment of the present invention, since a second pattern filling an edge region of a first pattern is formed on the first pattern, and a conductive layer is formed on the formed second pattern, it is possible to solve a reliability problem that occurs when a conductive layer permeates into a mask.

Further, according to an embodiment of the present invention, a conductive layer is formed after the second pattern is formed, so that a portion of the conductive layer, protruding from a side surface of a pad to an outside may be minimized, and thus structural reliability (stability) of the conductive layer can be secured.

Furthermore, according to an embodiment of the present invention, a conductive layer is formed after the second pattern is formed, so that a portion of a lower surface of the second pattern is disposed to be lower than an upper surface of the first pattern, and a thickness of the second pattern is thinner than that of the first pattern, and thus overspreading itself of the conductive layer can be inhibited.

In addition, according to an embodiment of the present invention, a conductive layer including gold (Au) is formed by using a plating seed layer used at the time of forming the first pattern and the second pattern, so that a nickel (Ni) seed layer which has served as a seed layer of a gold (Au) conductive layer in the related art may be removed, and thus, not only a thickness of a printed circuit board product can be reduced, but also economic efficiency of a product can be improved by technical effect due to efficiency of a process.

Further, according to an embodiment of the present invention, a nickel layer may be removed from a pattern structure, and thus not only electrical conductivity of a pattern can be improved, but also a problem of interface property occurring between copper and nickel constituting the pattern can be solved.

Furthermore, according to an embodiment of the present invention, a thickness of an upper conductive layer disposed on a pad for wire bonding and a thickness of a lower conductive layer disposed on a pad for soldering are differently applied, so that a consumption cost of gold used in the conductive layer may be reduced, and thus a thickness can be reduced.

In addition, according to an embodiment of the present invention, a plurality of conductive layers having different thicknesses may be formed by one simultaneous process, and thus efficiency in a manufacturing process can be improved.

Hereinafter, a method for manufacturing a printed circuit board according to an embodiment of the present invention will be described in detail.

FIGS. 8 to 15 are views for explaining a process sequence of a method of manufacturing a printed circuit board according to an embodiment of the present invention.

First, a multilayer insulating substrate 110 is manufactured. This is because an insulating layer 111 is prepared, a metal layer (not shown) is formed on the insulating layer 111, and the formed metal layer is etched to form a circuit pattern 112. Then, an additional insulating layer is stacked on both surfaces of the insulating layer 111 on which the circuit pattern is formed, and accordingly, the metal layer forming and etching process may be repeatedly performed to manufacture the multilayer insulating substrate 110. At this point, a via 113 may be formed by performing a via hole forming process and a metal material filling process in a portion where the via 113 is required in the process of stacking the insulating layer.

At this point, the process of manufacturing the multilayer insulating substrate 110 is well known in the art, and thus a detailed description thereof will be omitted.

Then, metal layers 125 and 145 are formed at the uppermost insulating layer and the lowermost insulating layer, respectively, of the multilayer insulating substrate 110.

The metal layers 125 and 145 serve as a seed layer for electrolytic-plating first and second pads 120 and 140 and upper and lower conductive layers 130 and 150.

The metal layers 125 and 145 may be formed by electroless plating. At this point, when the metal layers 125 and 145 are formed by electroless plating, roughness may be introduced to the surfaces of the uppermost insulating layer and the lowermost insulating layer for performing easy plating.

An electroless plating method may be processed by sequentially performing a degreasing process, a soft corrosion process, a preliminary catalyst processing process, a catalyst processing process, an activation process, an electroless plating process, and an oxidation inhibition processing process. Further, the metal layers 125 and 145 may be formed by sputtering metal particles using plasma instead of plating.

At this point, a de-smear process which removes smears of the surfaces of the uppermost insulating layer and the lowermost insulating layer may be additionally performed before plating the metal layers 125 and 145. The de-smear process is performed to make the surfaces of the uppermost insulating layer and the lowermost insulating layer rough to make plating easy for forming the metal layers 125 and 145.

Figure 9:
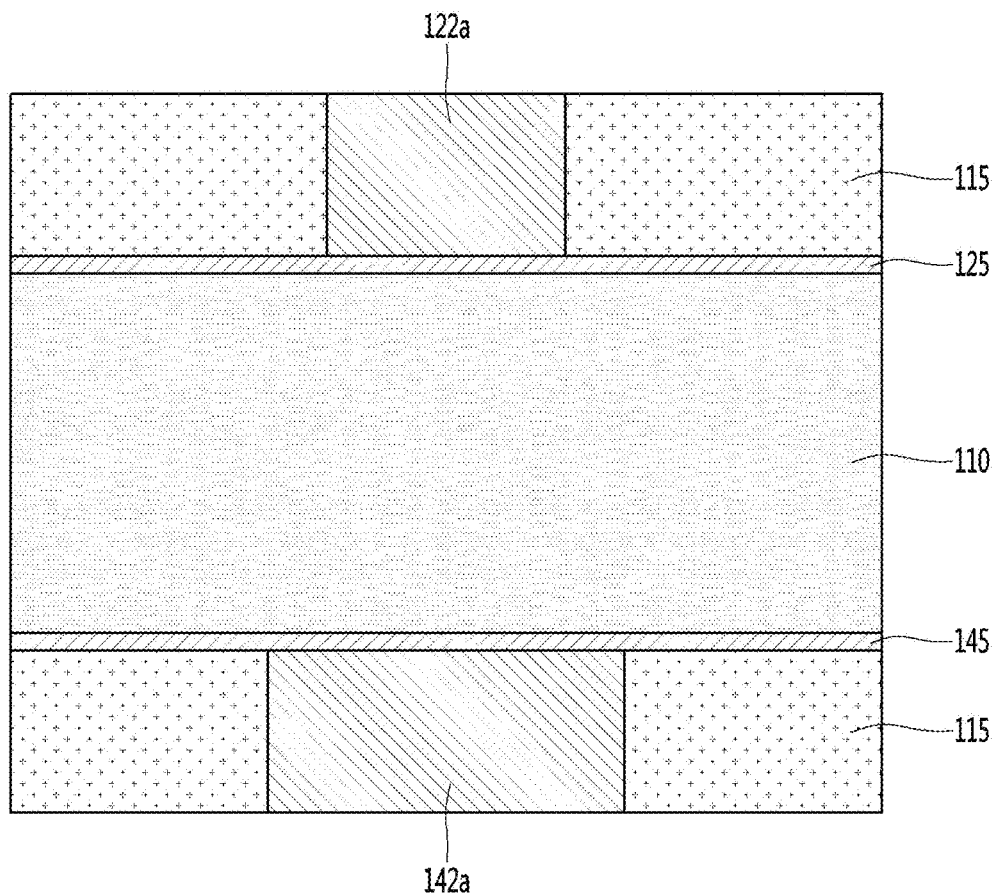

Then, referring to FIG. 9, a mask 115 is formed on the metal layers 125 and 145. At this point, the mask 115 has an opening exposing at least a part of the surfaces of the metal layers 125 and 145 to form the first pad 120 and the second pad 140. At this point, a dry film may be used as the mask 115.

Meanwhile, since the width of the first pad 120 and the width of the second pad 140 are different from each other, a width of the opening of the mask disposed on the uppermost insulating layer and a width of the opening of the mask disposed under the lowermost insulating layer may be different from each other.

At this point, the mask may be subjected to a plasma processing process. The plasma processing process is performed selectively and is not a necessary process to be included. However, when the plasma processing process was performed, the non-contact portions of the upper conductive layer 130 and the lower conductive layer 150 had different widths or shapes, and a better width or shape appeared in the case in which the plasma processing proceeded. Therefore, in order to obtain a better result, it may be preferable that the plasma processing process be performed.

Then, when the mask 115 is formed, a first plating layer 122*a* and a second plating layer 142*a* filling the openings of the mask 115 are formed by electrolytic plating with the metal layers 125 and 145 as a seed layer. The first plating layer 122*a* and the second plating layer 142*a* may be formed by electrolytic-plating a conductive material, for example, a metal including copper.

Figure 10:
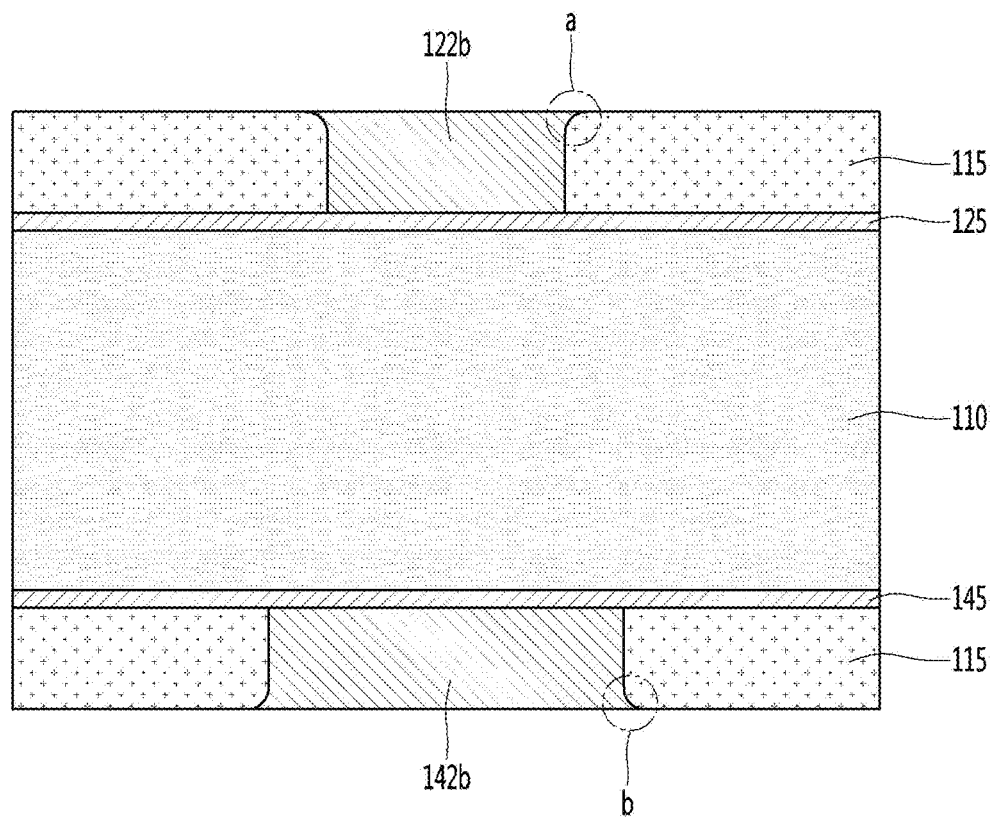

Then, referring to FIG. 10, via a polishing operation, a polishing process is performed to polish surfaces of the first plating layer 122*a* and the second plating layer 142*a* and a surface of the mask 115.

The polishing process refers to an operation of flatly polishing the surfaces of the plated first plating layer 122*a* and second plating layer 142*a*, so that polished first plating layer 122*b* and second plating layer 142*b* are formed.

At this point, in the polishing process, the polished first and second plating layers 122*b* and 142*b* have an overspreading phenomenon in which the upper surfaces of the polished first plating layer 122*b* and the second plating layer 142*b* protrude long in a longitudinal direction. In other words, when the polishing process is performed, the first plating layer 122*b* and the second plating layer 142*b* are spread into the mask 115. Therefore, the polished first plating layer 122*b* includes a first overspreading region (a) that overspreads into the mask, and the second plating layer 142*b* also includes a second overspreading region (b) that overspreads into the mask.

Figure 11:
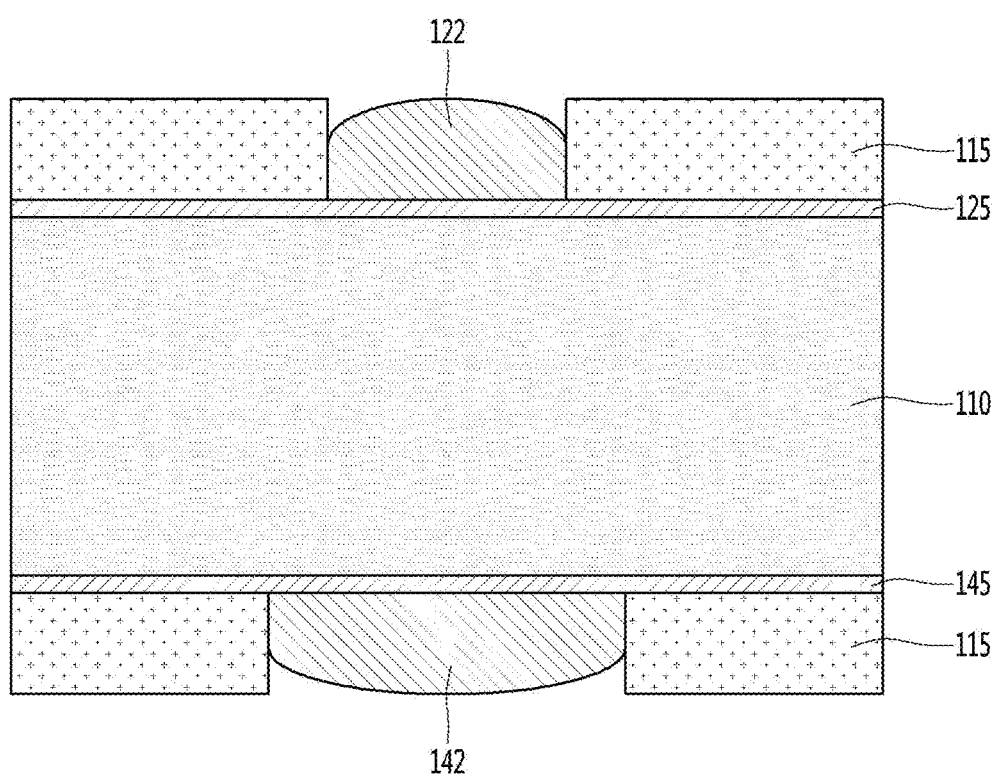

Then, referring to FIG. 11, when the polishing process is performed, upper regions of the polished first plating layer 122*b* and second plating layer 142*b* are etched via a preprocessing process. Here, when the preprocessing process is performed, not only the upper surfaces of the polished first plating layer 122*b* and the second plating layer 142*b* are etched, but also etching occurs at an interface between the upper surface and a side surface thereof.

Therefore, when the preprocessing process is completed, a first-first pattern 122 and a second-first pattern 142 having upper surfaces with a predetermined curvature are formed.

Figure 12:
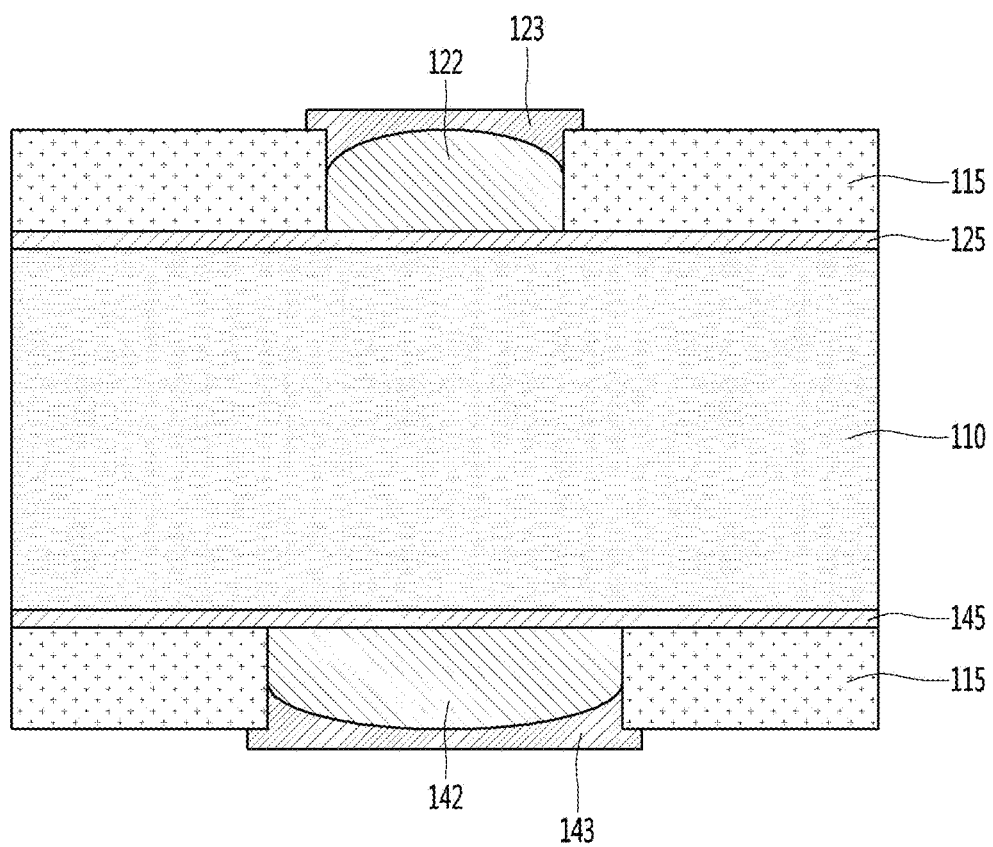

Then, referring to FIG. 12, when the preprocessing process is completed, a first-second pattern 123 and a second-second pattern 143 are formed on the first-first pattern 122 and the second-first pattern 142 via performing a flash plating process.

Figure 13:
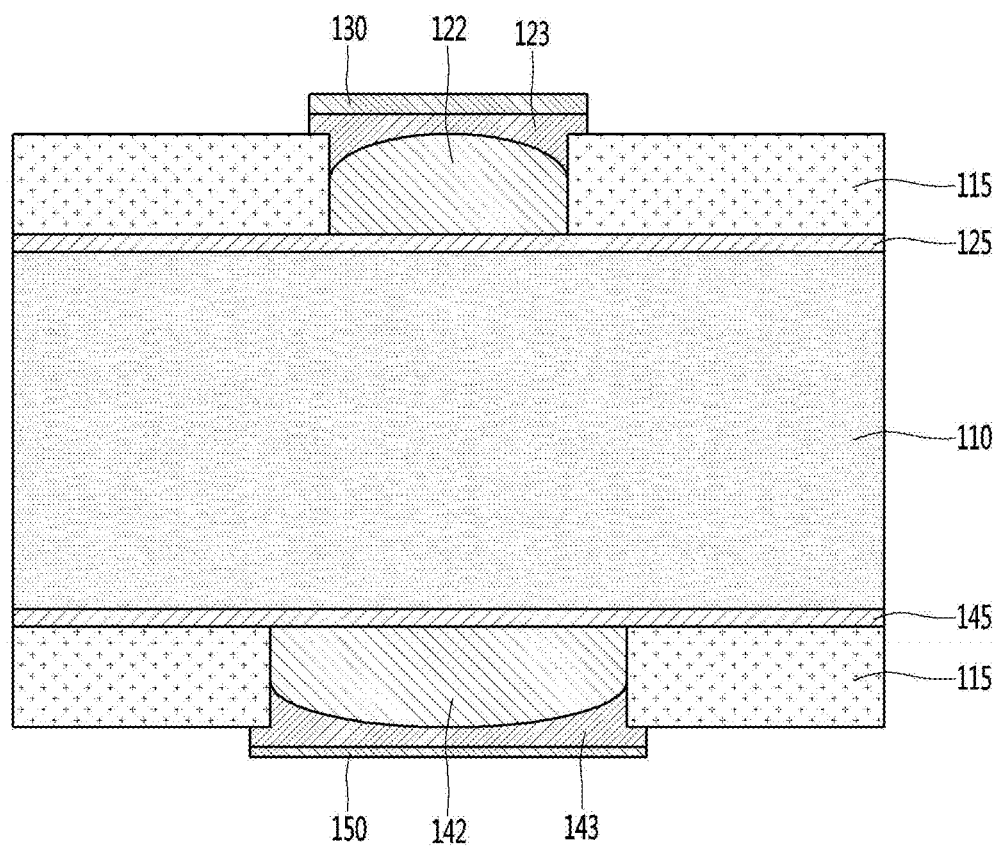

When the flash plating process is completed, as shown in FIG. 13, an upper conductive layer 130 is formed on the first-second pattern 123, and a lower conductive layer 150 is formed on the second-second pattern 143.

At this point, the upper conductive layer 130 and the lower conductive layer 150 are formed to have different thicknesses.

Figure 14:
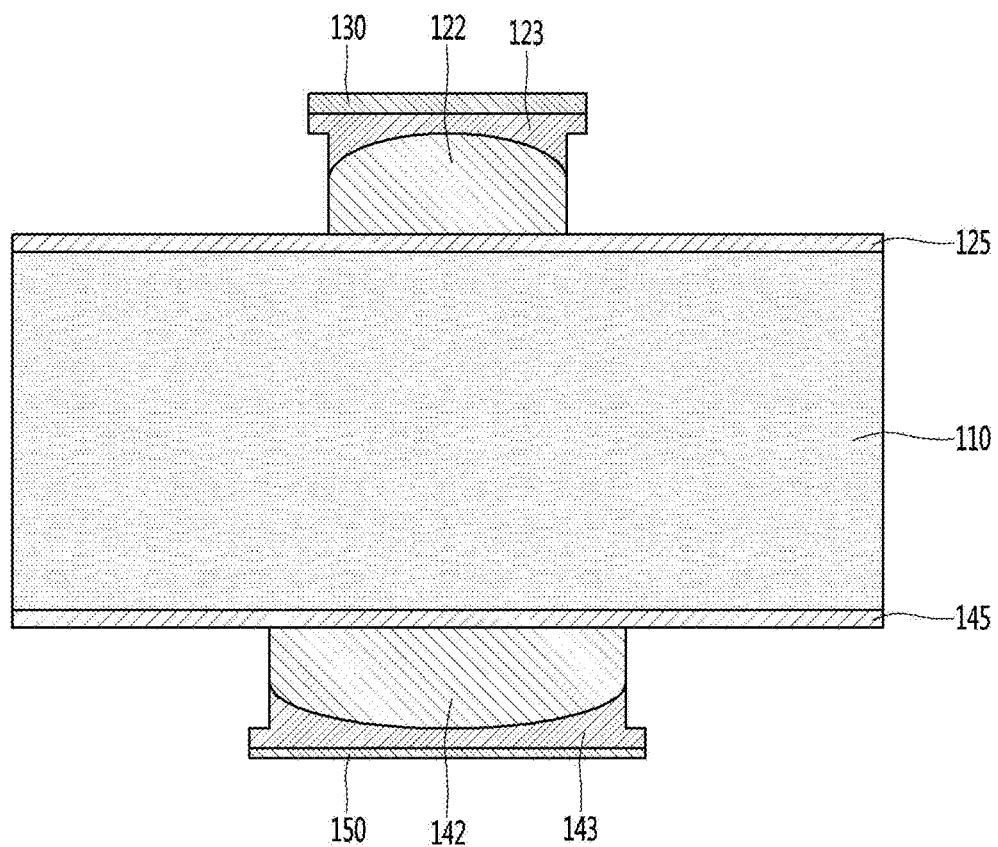

Then, as shown in FIG. 14, the mask 115 disposed on the metal layer is removed.

Figure 15:
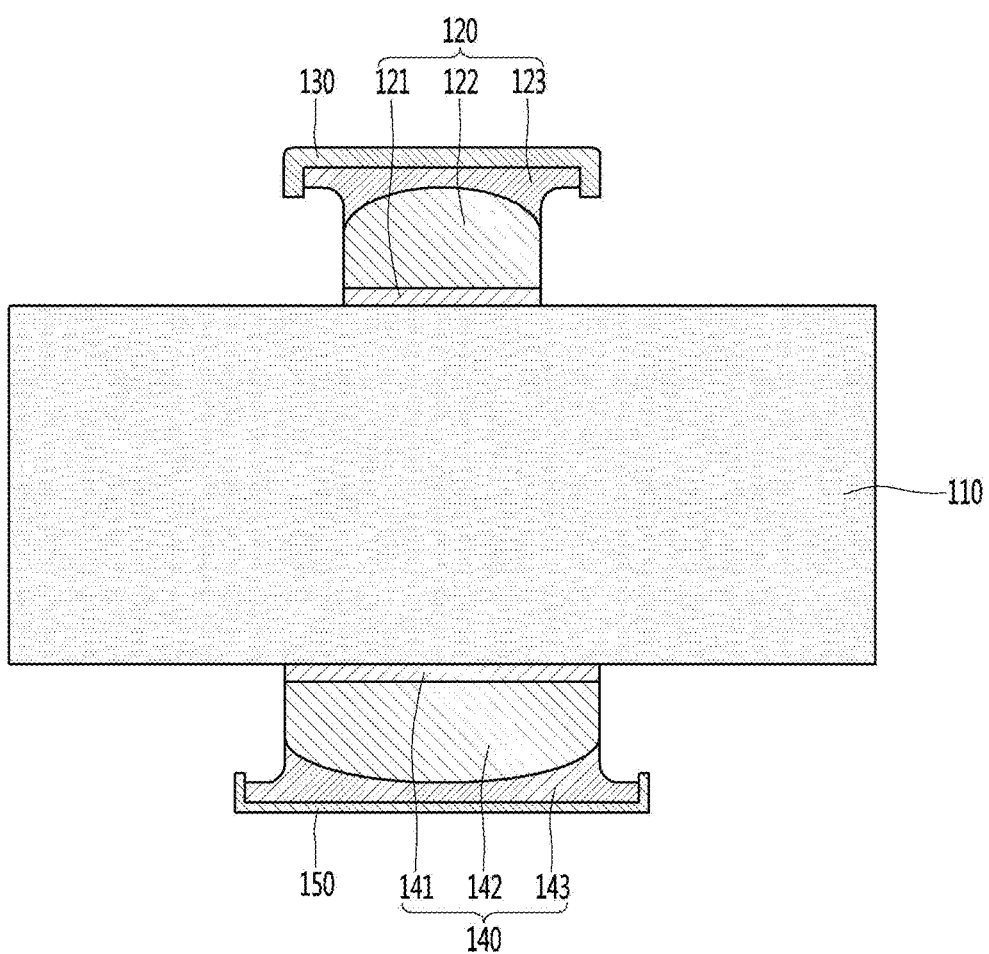

As shown in FIG. 15, the metal layers 125 and 145 are etched to remove remaining portions except for the seed layer disposed under the first-first pattern 122 and the second-first pattern 142. At this point, in the etching process of the metal layers 125 and 145, at least a part of the side surfaces of the first-first pattern 122, the first-second pattern 123, the second-first pattern 142 and the second-second pattern 143 may be etched. Therefore, the upper conductive layer 130 and the lower conductive layer 150 have an overhang structure as shown in the drawing.

According to an embodiment of the present invention, since a second pattern filling an edge region of a first pattern is formed on the first pattern, and an upper conductive layer and a lower conductive layer are formed on the formed second pattern, respectively, it is possible to solve a reliability problem that occurs when the upper conductive layer or the lower conductive layer permeates into a mask.

In addition, according to an embodiment of the present invention, an upper conductive layer or a lower conductive layer is formed after the second pattern is formed, so that a portion, protruding from a side surface of a pad to an outside thereof, of the upper conductive layer and the lower conductive layer may be minimized, and thus structural reliability (stability) of the upper conductive layer and the lower conductive layer can be secured.

Further, according to an embodiment of the present invention, an upper conductive layer and a lower conductive layer are formed after the second pattern is formed, so that a portion of a lower surface of the second pattern may be disposed to be lower than an upper surface of the first pattern, and a thickness of the second pattern may be thinner than that of the first pattern, and thus overspreading itself of the upper conductive layer or the lower conductive layer can be inhibited.

Furthermore, according to an embodiment of the present invention, an upper conductive layer and a lower conductive layer including gold (Au) are formed by using a plating seed layer used at the time of forming the first pattern and the second pattern, so that a nickel (Ni) seed layer which has served as a seed layer of a gold (Au) conductive layer in the related art may be removed, and thus, not only a thickness of a printed circuit board product can be reduced, but also economic efficiency of a product can be improved by technical effect due to efficiency of a process.

In addition, according to an embodiment of the present invention, a nickel layer may be removed from a pattern structure, and thus not only electrical conductivity of a pattern can be improved, but also a problem of interface property occurring between copper and nickel constituting the pattern can be solved.

Further, according to an embodiment of the present invention, a thickness of an upper conductive layer disposed on a pad for wire bonding and a thickness of a lower conductive layer disposed on a pad for soldering are differently applied, so that a consumption cost of gold used for the upper conductive layer and the lower conductive layer may be reduced, and thus a thickness can be reduced.

Furthermore, according to an embodiment of the present invention, a plurality of conductive layers having different thicknesses may be formed by one simultaneous process, respectively, and thus efficiency in a manufacturing process can be improved.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that contents related to such a combination and such a modification are included in the scope of the embodiments.

Embodiments are mostly described above. But, they are only examples and do not limit the embodiments. A person skilled in the art to which the embodiments pertain may appreciate that several variations and applications not presented above may be made without departing from the essential characteristic of the embodiments. For example, each component particularly represented in the embodiments may be varied. In addition, it should be construed that differences related to such a variation and such an application are included in the scope of the embodiment defined in the following claims.

What is claimed is:

1. A printed circuit board comprising:
an insulating layer;
a first pad disposed on a first surface of the insulating layer;
a first conductive layer disposed on the first pad and including gold (Au);
a second pad disposed on a second surface of the insulating layer; and
a second conductive layer disposed on the second pad and including gold (Au),
wherein the first conductive layer is thicker than the second conductive layer, and
wherein a width of an upper surface of the first pad is larger than that of a lower surface thereof.

2. The printed circuit board of claim 1, wherein the first conductive layer is a conductive layer connected to a wire, and the second conductive layer is a conductive layer connected to a solder.

3. The printed circuit board of claim 1, wherein:
the insulating layer includes a plurality of insulating layers;
the first pad is disposed on an upper surface of an insulating layer disposed at an uppermost portion of the plurality of insulating layers; and
the second pad is disposed under a lower surface of an insulating layer disposed at a lowermost portion of the plurality of insulating layers.

4. The printed circuit board of claim 1, wherein the first pad has a narrower width than the second pad.

5. The printed circuit board of claim 1, wherein the first conductive layer has a thickness in a range of 0.2 to 0.8 µm, and the second conductive layer has a thickness in a range of 0.05 to 0.3 µm.

6. The printed circuit board of claim 3, wherein each of the first pad and the second pad includes:
a plating seed layer disposed at a surface of the uppermost insulating layer or the lowermost insulating layer and including copper;
a first pattern disposed on the plating seed layer and including copper; and
a second pattern disposed on the first pattern and including copper.

7. The printed circuit board of claim 6, wherein the first pattern is thicker than the second pattern.

8. The printed circuit board of claim 6, wherein a central portion of an upper surface of the first pattern is located lower than an outer side portion thereof.

9. The printed circuit board of claim 8, wherein a part of a lower surface of the second pattern is located lower than a part of the upper surface of the first pattern.

10. The printed circuit board of claim 6, wherein each of the first and second conductive layers includes a first region in contact with the second pattern and a second region extending from the first region and spaced apart from the plating seed layer, the first pattern and the second pattern,
wherein the second region is not in contact with the plating seed layer, the first pattern, and the second pattern.

11. The printed circuit board of claim 9, wherein the second region includes a first portion in direct contact with an upper surface of the second pattern and a second portion in direct contact with a side surface of the second pattern.

12. A printed circuit board comprising:
an insulating layer;
a pad disposed on the insulating layer; and
a conductive layer disposed on the pad,
wherein the conductive layer includes:
a first region in direct contact with an upper surface of the pad, and
a second region extending from the first region and spaced apart from the pad,
wherein the pad includes:
a first pad disposed on a first surface of the insulating layer, and a second pad disposed on a second surface of the insulating layer opposite to the first surface, and wherein a width of an upper surface of the first pad is larger than that of a lower surface thereof.

13. The printed circuit board of claim 12, wherein the conductive layer includes
a third region disposed between the first region and the second region, and in direct contact with a side surface of the pad.

14. The printed circuit board of claim 13, wherein:
the conductive layer includes a first conductive layer disposed on the first pad and including gold (Au) and a second conductive layer disposed on the second pad and including gold (Au); and
each of the first and second conductive layers includes the first to third regions.

15. The printed circuit board of claim 14, wherein a thickness of the first region in a longitudinal direction of the first conductive layer is greater than that of the first region in a longitudinal direction of the second conductive layer.

16. The printed circuit board of claim 14, wherein a thickness of the third region in a lateral direction of the first conductive layer is greater than that of the third region in a lateral direction of the second conductive layer.

17. The printed circuit board of claim 14, wherein each of the first pad and the second pad includes:

a plating seed layer disposed on the first surface or the second surface of the insulating layer and including copper;

a first pattern disposed on the plating seed layer and including copper; and a second pattern disposed on the first pattern and including copper.

18. The printed circuit board of claim 17, wherein an end portion of the second region of the first conductive layer is located higher than an outer side region of an upper surface of the first pattern constituting the first pad, and
an end portion of the second region of the second conductive layer is located lower than an outer side region of a lower surface of the first pattern constituting the second pad.

19. The printed circuit board of claim 14, wherein a thickness of the second region in a longitudinal direction of the first conductive layer is different from that of the second region in a longitudinal direction of the second conductive layer.

20. The printed circuit board of claim 14, wherein the first conductive layer is a conductive layer directly connected to a wire, and the second conductive layer is a conductive layer directly connected to a solder.

* * * * *